United States Patent
Bliss et al.

(10) Patent No.: US 8,132,084 B2
(45) Date of Patent: *Mar. 6, 2012

(54) SUPER BLOCK ERROR CORRECTION CODE (ECC) ADAPTABLE TO COMMUNICATION SYSTEMS INCLUDING HARD DISK DRIVES (HDDS) AND OTHER MEMORY STORAGE DEVICES

(75) Inventors: William Gene Bliss, Thornton, CO (US); Gregory L. Silvus, Boulder, CO (US); John P. Mead, Longmont, CO (US); Thomas V. Souvignier, Longmont, CO (US)

(73) Assignee: Broadcom Corporation, Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/191,628

(22) Filed: Jul. 27, 2011

(65) Prior Publication Data
US 2011/0283167 A1    Nov. 17, 2011

Related U.S. Application Data

(63) Continuation of application No. 11/855,838, filed on Sep. 14, 2007, now Pat. No. 8,024,637.

(60) Provisional application No. 60/921,387, filed on Apr. 2, 2007.

(51) Int. Cl.
*H03M 13/00* (2006.01)

(52) U.S. Cl. ......... 714/784; 714/755; 714/758; 714/792
(58) Field of Classification Search ................ 714/758, 714/784, 799
See application file for complete search history.

(56) References Cited

U.S. PATENT DOCUMENTS

| | | | |
|---|---|---|---|
| 6,463,564 B1 * | 10/2002 | Weng | 714/784 |
| 6,584,143 B2 * | 6/2003 | Yu | 375/147 |
| 6,587,501 B2 * | 7/2003 | Yu | 375/147 |
| 6,920,602 B1 * | 7/2005 | Park et al. | 714/788 |
| 6,928,604 B2 * | 8/2005 | Park et al. | 714/788 |
| 6,987,543 B1 * | 1/2006 | Mogre et al. | 348/608 |

* cited by examiner

*Primary Examiner* — Esaw Abraham
(74) *Attorney, Agent, or Firm* — Garlick Harrison & Markison; Shayne X. Short

(57) ABSTRACT

Super block error correction code (ECC) adaptable to communication systems including hard disk drives (HDDs) and other memory storage devices. A means is presented by which a number of blocks of information can be organized, with a degree of ECC provided thereto, and transmitted via a signal into a communication channel. In some instances, the communication channel is coupled to a storage media as in the context of an HDD, and information is written to and read from the storage media via this communication channel (e.g., "read channel"). This means is particularly well suited to applications that provide large amounts of data via any one transmission (e.g., DVR/PVR (Digital/Personal Video Recorder)). A redundant block is generated using the information of each of a number of information blocks thereby provided extra ECC on a large portion of data, and that redundant block also undergoes ECC encoding.

20 Claims, 18 Drawing Sheets

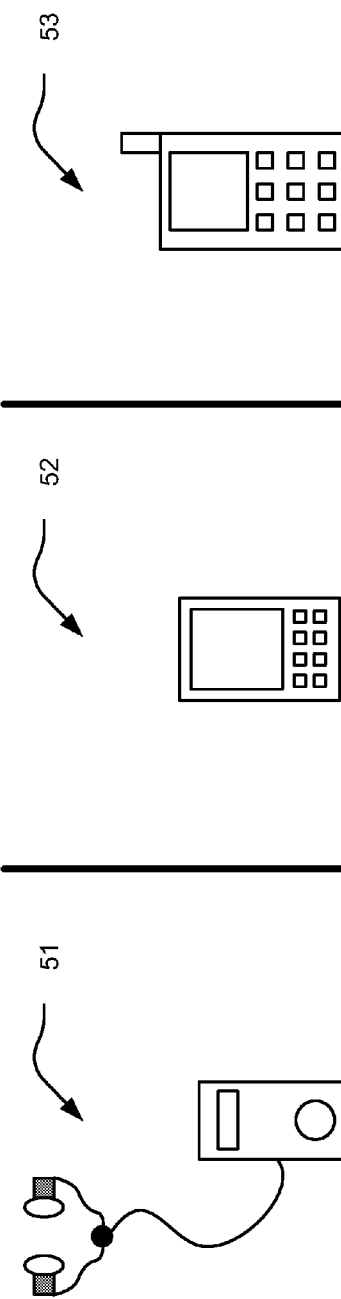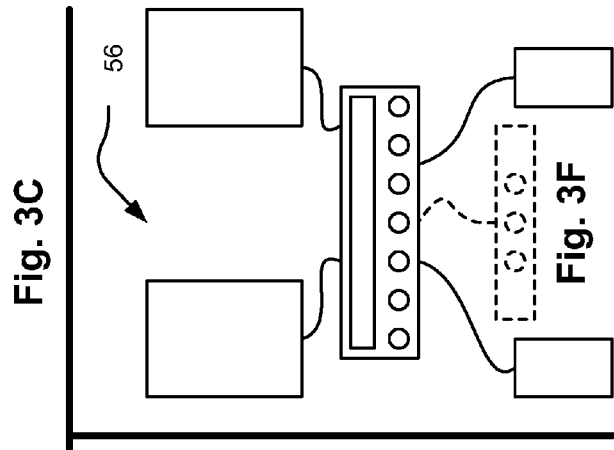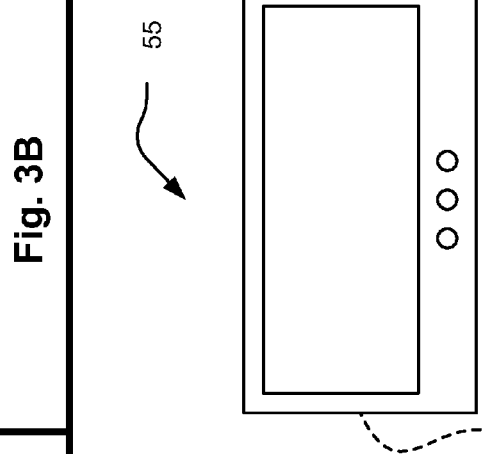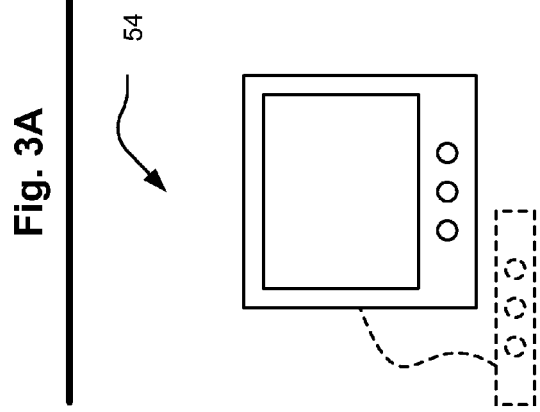

SUPER BLOCK ERROR CORRECTION CODE (ECC) ADAPTABLE TO COMMUNICATION SYSTEMS INCLUDING HARD DISK DRIVES (HDDS) AND OTHER MEMORY STORAGE DEVICES

CROSS REFERENCE TO RELATED PATENTS/PATENT APPLICATIONS

Continuation Priority Claim, 35 U.S.C. §120

The present U.S. Utility Patent Application claims priority pursuant to 35 U.S.C. §120, as a continuation, to the following U.S. Utility Patent Application which is hereby incorporated herein by reference in its entirety and made part of the present U.S. Utility Patent Application for all purposes:

1. U.S. Utility patent application Ser. No. 11/855,838, entitled "Super block error correction code (ECC) adaptable to communication systems including hard disk drives (HDDs) and other memory storage devices,", filed Sep. 14, 2007, now issued as U.S. Pat. No. 8,024,637 on Sep. 20, 2011, which claims priority pursuant to 35 U.S.C. §119(e) to the following U.S. Provisional Patent Application which is hereby incorporated herein by reference in its entirety and made part of the present U.S. Utility Patent Application for all purposes:

a. U.S. Provisional Patent Application Ser. No. 60/921,387, entitled "Super block error correction code (ECC) adaptable to communication systems including hard disk drives (HDDs) and other memory storage devices,", filed Apr. 2, 2007, now expired.

BACKGROUND OF THE INVENTION

1. Technical Field of the Invention

The invention relates generally to communication systems; and, more particularly, it relates to communication systems (including hard disk drive (HDD) systems) having communication channels that introduce ISI (Inter-Symbol Interference) to signal transmitted therein.

2. Description of Related Art

Data communication systems have been under continual development for many years. One such type of communication system that has been of significant interest lately is a communication system that employs iterative error correction codes. Communications systems with iterative codes are often able to achieve lower bit error rates (BER) than alternative codes for a given signal to noise ratio (SNR).

A continual and primary directive in this area of development has been to try continually to lower the SNR required to achieve a given BER within a communication system. The ideal goal has been to try to reach Shannon's limit in a communication channel. Shannon's limit may be viewed as being the data rate to be used in a communication channel, having a particular SNR, that achieves error free transmission through the communication channel In other words, the Shannon limit is the theoretical bound for channel capacity for a given modulation and code rate.

As is known, many varieties of memory storage devices (e.g. hard disk drives (HDDs)), such as magnetic disk drives are used to provide data storage for a host device, either directly, or through a network such as a storage area network (SAN) or network attached storage (NAS). Such a memory storage system (e.g., a HDD) can itself be viewed as a communication system in which information is encoded and provided via a communication channel to a storage media; the reverse direction of communication is also performed in a HDD in which data is read from the media and passed through the communication channel (e.g., sometimes referred to as a read channel in the HDD context) at which point it is decoded to makes estimates of the information that is read.

Typical host devices include stand alone computer systems such as a desktop or laptop computer, enterprise storage devices such as servers, storage arrays such as a redundant array of independent disks (RAID) arrays, storage routers, storage switches and storage directors, and other consumer devices such as video game systems and digital video recorders. These devices provide high storage capacity in a cost effective manner.

Certain devices that employ hard disk drives (HDDs) are sometimes implemented within applications that employ or require streaming information. Some examples of such applications include those that perform playback of some form of digital data (e.g., digital audio or digital video information). One example of a digital audio player is a portable digital audio device that includes some type of HDD that is operable to perform playback of digital audio information that can comport with any of a wide variety of formats or standards. Even another example of such a device that is operable to perform playback of digital data (e.g., digital audio or digital video information) is a device that is designed to perform playback of digital video (e.g., a DVR (Digital Video Recorder) type device and/or a PVR (Personal Video Recorder) type device). Many modern STBs (Set Top Boxes) that are designed to provide decoded information to a display device (e.g., some type of television) also include some form or memory storage as well. Some devices are stand-alone and operate also to record and/or playback such digital information to a display device.

The speed at which the digital information is provided from the HDD or other storage means within these devices typically is provided at a very fast rate. Sometimes, the speed at which this information can be provided from the HDD or other storage means is much faster than the rate at which the playback of digital data is being performed.

BRIEF SUMMARY OF THE INVENTION

The present invention is directed to apparatus and methods of operation that are further described in the following Brief Description of the Several Views of the Drawings, the Detailed Description of the Invention, and the claims. Other features and advantages of the present invention will become apparent from the following detailed description of the invention made with reference to the accompanying drawings.

BRIEF DESCRIPTION OF THE SEVERAL VIEWS OF THE DRAWINGS

FIG. 3A illustrates an embodiment of a handheld audio unit.

FIG. 3B illustrates an embodiment of a handheld video unit.

FIG. 3C illustrates an embodiment of a wireless communication device.

FIG. 3D illustrates an embodiment of a television.

FIG. 3E illustrates an embodiment of a HD (High Definition) television.

FIG. 3F illustrates an embodiment of an audio device.

DETAILED DESCRIPTION OF THE INVENTION

Figure 1:
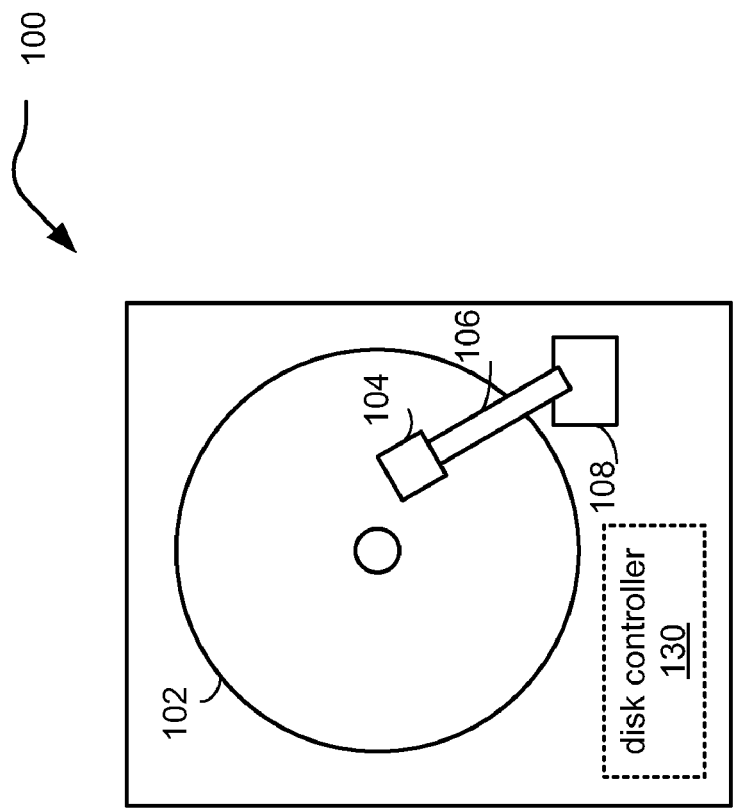
FIG. 1 illustrates an embodiment of a disk drive unit.

A novel approach is presented herein that is operable to provide an extra degree of error correction code (ECC) protection to large amounts of data. A number of blocks of information can be organized, with a degree of ECC provided thereto, and transmitted via a signal into a communication channel. In some instances, the communication channel is coupled to a storage media as in the context of an hard disk drive (HDD), and information is written to and read from the storage media via this communication channel (e.g., sometimes referred to as a "read channel" in the HDD context). This means is particularly well suited to applications that provide large amounts of data via any one transmission (e.g., devices that perform playback of digital media DVR (Digital Video Recorder), PVR (Personal Video Recorder), and/or other digital media playback devices including audio playback devices). A redundant block is generated using the information of each of a number of information blocks thereby provided extra ECC on a large portion of data, and that redundant block also undergoes ECC encoding which provide yet another layer of protection to the data; together all of these encoded blocks (including the redundant encoded block) form an ECC super block.

In the HDD context, these encoded blocks (including the redundant encoded block) of the ECC super block can be provided to a storage media and written to sectors of the media in a wide variety of manners (E.g., according to any of a variety of patterns). For example, each individual "encoded block" of the ECC super block can have a physical correspondence to sectors of the storage media. Alternatively, the sectors of the storage media can be have a logical partition, and the "encoded block" of the ECC super block can have a physical correspondence to sectors of the storage media. Moreover, the pattern used to write these "encoded block" of the ECC super block to the storage media can be performed so that (1) sectors of an entire track includes the "encoded blocks" of an ECC super block, (2) sectors of multiple tracks include the "encoded blocks" of an ECC super block, (3) every $K^{th}$ sector of a track (or number of tracks) includes the "encoded blocks" of an ECC super block, (4) a sub-set of sectors of an entire track includes the "encoded blocks" of an ECC super block, (5) a sub-set of sectors of multiple tracks include the "encoded blocks" of an ECC super block, (6) the "encoded blocks" of an ECC super block can be written via an interleaved (π) pattern to any of a selected number of sectors of any of a selected number of tracks, and so on. There are a wide variety of means in which the "encoded blocks" of an ECC super block can be written to various sectors of a storage media of an HDD, some additional illustration of which are provided herein as well. It is noted that additional patterns by which the "encoded blocks" of an ECC super block can be written to various sectors of a storage media of an HDD may also be performed without departing from the scope and spirit of the invention.

It is also noted that the means of employing ECC super block cam also be employed generally to a wide variety of communication systems beyond those of an HDD context.

FIG. 1 illustrates an embodiment of a disk drive unit 100. In particular, disk drive unit 100 includes a disk 102 that is rotated by a servo motor (not specifically shown) at a velocity such as 3600 revolutions per minute (RPM), 4200 RPM, 4800 RPM, 5,400 RPM, 7,200 RPM, 10,000 RPM, 15,000 RPM; however, other velocities including greater or lesser velocities may likewise be used, depending on the particular application and implementation in a host device. In one possible embodiment, disk 102 can be a magnetic disk that stores information as magnetic field changes on some type of magnetic medium. The medium can be a rigid or non-rigid, removable or non-removable, that consists of or is coated with magnetic material.

Disk drive unit 100 further includes one or more read/write heads 104 that are coupled to arm 106 that is moved by actuator 108 over the surface of the disk 102 either by translation, rotation or both. A disk controller 130 is included for controlling the read and write operations to and from the drive, for controlling the speed of the servo motor and the motion of actuator 108, and for providing an interface to and from the host device.

Figure 2:
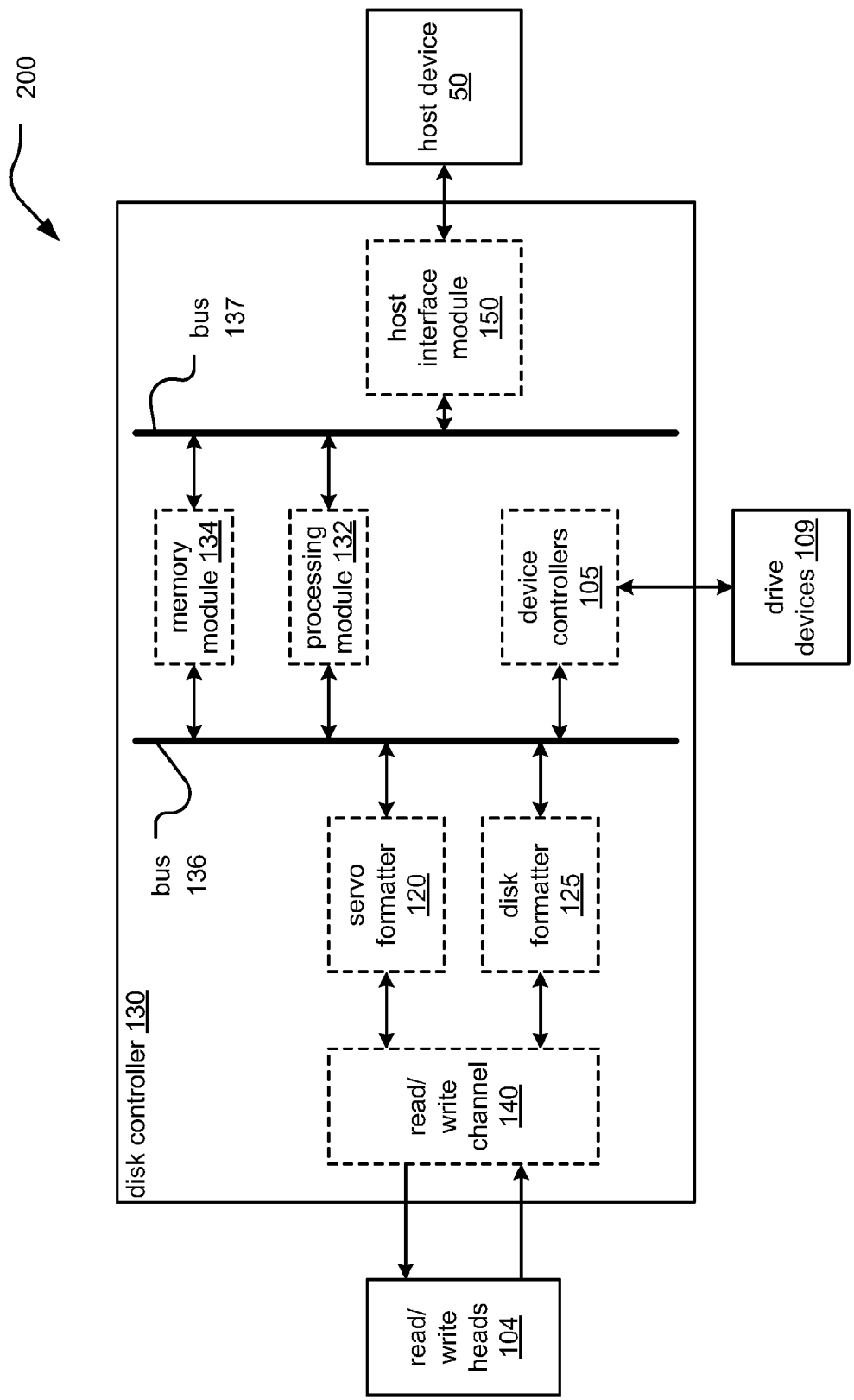
FIG. 2 illustrates an embodiment of an apparatus that includes a disk controller.

FIG. 2 illustrates an embodiment of an apparatus 200 that includes a disk controller 130. In particular, disk controller 130 includes a read/write channel 140 for reading and writing data to and from disk 102 through read/write heads 104. Disk formatter 125 is included for controlling the formatting of data and provides clock signals and other timing signals that control the flow of the data written to, and data read from disk 102. Servo formatter 120 provides clock signals and other timing signals based on servo control data read from disk 102. Device controllers 105 control the operation of drive devices 109 such as actuator 108 and the servo motor, etc. Host interface 150 receives read and write commands from host device 50 and transmits data read from disk 102 along with other control information in accordance with a host interface protocol. In one embodiment, the host interface protocol can include, SCSI, SATA, enhanced integrated drive electronics (EIDE), or any number of other host interface protocols, either open or proprietary that can be used for this purpose.

Disk controller 130 further includes a processing module 132 and memory module 134. Processing module 132 can be implemented using one or more microprocessors, micro-controllers, digital signal processors, microcomputers, central processing units, field programmable gate arrays, programmable logic devices, state machines, logic circuits, analog circuits, digital circuits, and/or any devices that manipulates signal (analog and/or digital) based on operational instructions that are stored in memory module 134. When processing module 132 is implemented with two or more devices, each device can perform the same steps, processes or functions in order to provide fault tolerance or redundancy. Alternatively, the function, steps and processes performed by processing module 132 can be split between different devices to provide greater computational speed and/or efficiency.

Memory module 134 may be a single memory device or a plurality of memory devices. Such a memory device may be a read-only memory, random access memory, volatile memory, non-volatile memory, static random access memory (SRAM), dynamic random access memory (DRAM), flash memory, cache memory, and/or any device that stores digital information. Note that when the processing module 132 implements one or more of its functions via a state machine, analog circuitry, digital circuitry, and/or logic circuitry, the memory module 134 storing the corresponding operational instructions may be embedded within, or external to, the circuitry comprising the state machine, analog circuitry, digital circuitry, and/or logic circuitry. Further note that, the memory module 134 stores, and the processing module 132 executes, operational instructions that can correspond to one or more of the steps or a process, method and/or function illustrated herein.

Disk controller 130 includes a plurality of modules, in particular, device controllers 105, processing module 132, memory module 134, read/write channel 140, disk formatter 125, and servo formatter 120 that are interconnected via bus 136 and bus 137. The host interface 150 can be connected to only the bus 137 and communicates with the host device 50. Each of these modules can be implemented in hardware, firmware, software or a combination thereof, in accordance with the broad scope of the present invention. While a particular bus architecture is shown in FIG. 2 with buses 136 and 137, alternative bus architectures that include either a single bus configuration or additional data buses, further connectivity, such as direct connectivity between the various modules, are likewise possible to implement the features and functions included in various embodiments.

In one possible embodiment, one or more modules of disk controller 130 are implemented as part of a system on a chip (SoC) integrated circuit. In an embodiment, this SoC integrated circuit includes a digital portion that can include additional modules such as protocol converters, linear block code encoding and decoding modules, etc., and an analog portion that includes device controllers 105 and optionally additional modules, such as a power supply, etc. In a further embodiment, the various functions and features of disk controller 130 are implemented in a plurality of integrated circuit devices that communicate and combine to perform the functionality of disk controller 130.

When the drive unit 100 is manufactured, disk formatter 125 writes a plurality of servo wedges along with a corresponding plurality of servo address marks at equal radial distance along the disk 102. The servo address marks are used by the timing generator for triggering the "start time" for various events employed when accessing the media of the disk 102 through read/write heads 104.

FIG. 3A illustrates an embodiment of a handheld audio unit 51. In particular, disk drive unit 100 can be implemented in the handheld audio unit 51. In one possible embodiment, the disk drive unit 100 can include a small form factor magnetic hard disk whose disk 102 has a diameter 1.8" or smaller that is incorporated into or otherwise used by handheld audio unit 51 to provide general storage or storage of audio content such as motion picture expert group (MPEG) audio layer 3 (MP3) files or Windows Media Architecture (WMA) files, video content such as MPEG4 files (or data comporting to any other form of MPEG standard including the various versions of video standards therein) for playback to a user, and/or any other type of information that may be stored in a digital format. While the handheld audio unit 51 may be incapable to perform playback of the video content of digital stored within the disk drive unit 100 included therein, the disk drive unit 100 can nevertheless store that information.

FIG. 3B illustrates an embodiment of a handheld video unit 52. In particular, disk drive unit 100 can be implemented in the handheld video unit 52. The handheld audio unit 52 can also be designed to perform playback of digital audio data as well as digital video data. In one possible embodiment, disk drive unit 100 can include a small form factor magnetic hard disk whose disk 102 has a diameter 1.8" or smaller, a 2.5" or 3.5" drive or larger drive for applications such as enterprise storage applications. Disk drive 100 is incorporated into or otherwise used by handheld audio unit 52 to provide general purpose storage for any type of information in digital format including audio content such as motion picture expert group (MPEG) audio layer 3 (MP3) files or Windows Media Architecture (WMA) files, video content such as MPEG4 files (or data comporting to any other form of MPEG standard including the various versions of video standards therein) for playback to a user, and/or any other type of information that may be stored in a digital format.

FIG. 3C illustrates an embodiment of a wireless communication device 53. In particular, disk drive unit 100 can be implemented in the wireless communication device 53. In one possible embodiment, disk drive unit 100 can include a small form factor magnetic hard disk whose disk 102 has a diameter 1.8" or smaller that is incorporated into or otherwise used by wireless communication device 53 to provide general storage or storage of audio content such as motion picture expert group (MPEG) audio layer 3 (MP3) files or Windows Media Architecture (WMA) files, video content such as MPEG4 files (or data comporting to any other form of MPEG standard including the various versions of video standards therein), JPEG (joint photographic expert group) files, bitmap files and files stored in other graphics formats that may be captured by an integrated camera or downloaded to the wireless communication device 53, emails, webpage information and other information downloaded from the Internet, address book information, and/or any other type of information that may be stored in a digital format.

In a possible embodiment, wireless communication device 53 is capable of communicating via a wireless telephone network such as a cellular, personal communications service (PCS), general packet radio service (GPRS), global system for mobile communications (GSM), and integrated digital enhanced network (iDEN) or other wireless communications network capable of sending and receiving telephone calls. Further, wireless communication device 53 is capable of communicating via the Internet to access email, download content, access websites, and provide steaming audio and/or video programming. In this fashion, wireless communication device 53 can place and receive telephone calls, text messages such as emails, short message service (SMS) messages, pages and other data messages that can include attachments such as documents, audio files, video files, images and other graphics.

FIG. 3D illustrates an embodiment of a television 54. The television 54 is operable to perform playback of digital information including digital video data and digital audio data within any one or a wide variety of formats including those which comport to various digital audio and video standards. The television 54 is implemented in the traditional screen size format (e.g., 4:3 aspect ratio). The television 54 can be coupled to another device that includes disk drive unit 100, or disk drive unit 100 can be implemented within the television 54 (i.e., integrated into the television 54).

In one possible embodiment, disk drive unit 100 can include a small form factor magnetic hard disk whose disk 102 has a diameter 1.8" or smaller that is incorporated into or otherwise used by television to provide general storage or storage of audio content such as motion picture expert group (MPEG) audio layer 3 (MP3) files or Windows Media Architecture (WMA) files, video content such as MPEG4 files (or data comporting to any other form of MPEG standard including the various versions of video standards therein), JPEG (joint photographic expert group) files, bitmap files and files stored in other graphics formats, emails, webpage information and other information downloaded from the Internet, address book information, and/or any other type of information that may be stored in a digital format.

In other possible embodiments, disk drive unit 100 can include a magnetic hard disk whose disk 102 that has a diameter of another size including a size that is typical to a HDD or other memory storage device employed in the art within such audio or video data storage means such as those employed within DVRs (Digital Video Recorders) and/or PVRs (Personal Video Recorders).

FIG. 3E illustrates an embodiment of a HD (High Definition) television 55. The HD television 55 is operable to perform playback of digital information including digital video data and digital audio data within any one or a wide variety of formats including those which comport to various digital audio and video standards. The HD television 55 is implemented in a widescreen size format (e.g., 16:9 aspect ratio or other widescreen ratio). The HD television 55 can be coupled to another device that includes disk drive unit 100, or disk drive unit 100 can be implemented within the HD television 55 (i.e., integrated into the television 55).

In one possible embodiment, disk drive unit 100 can include a small form factor magnetic hard disk whose disk 102 has a diameter 1.8" or smaller that is incorporated into or otherwise used by television to provide general storage or storage of audio content such as motion picture expert group (MPEG) audio layer 3 (MP3) files or Windows Media Architecture (WMA) files, video content such as MPEG4 files (or data comporting to any other form of MPEG standard including the various versions of video standards therein), JPEG (joint photographic expert group) files, bitmap files and files stored in other graphics formats, emails, webpage information and other information downloaded from the Internet, address book information, and/or any other type of information that may be stored in a digital format.

In other possible embodiments, disk drive unit 100 can include a magnetic hard disk whose disk 102 that has a diameter of another size including a size that is typical to a HDD or other memory storage device employed in the art within such audio or video data storage means such as those employed within DVRs (Digital Video Recorders) and/or PVRs (Personal Video Recorders).

FIG. 3F illustrates an embodiment of an audio device 56. This embodiment of the audio device 56 includes a non-portable audio device that is operable to perform playback of any one of a wide variety of digital audio data. This audio device 56 includes a number of speakers (e.g., tweeters, woofers, sub-woofers, and/or other speaker types) that are operable to perform the last leg of electric to acoustic conversion for playback of the digital audio data.

The audio device 56 can be coupled to another device that includes disk drive unit 100, or disk drive unit 100 can be implemented within the audio device 56 (i.e., integrated into the audio device 56).

In one possible embodiment, disk drive unit 100 can include a small form factor magnetic hard disk whose disk 102 has a diameter 1.8" or smaller that is incorporated into or otherwise used by television to provide general storage or storage of audio content such as motion picture expert group (MPEG) audio layer 3 (MP3) files or Windows Media Architecture (WMA) files, video content such as MPEG4 files (or data comporting to any other form of MPEG standard including the various versions of video standards therein), JPEG (joint photographic expert group) files, bitmap files and files stored in other graphics formats, emails, webpage information and other information downloaded from the Internet, address book information, and/or any other type of information that may be stored in a digital format.

In other possible embodiments, disk drive unit 100 can include a magnetic hard disk whose disk 102 that has a diameter of another size as well. While the audio device 56 may be incapable to perform playback of the non-audio content of digital stored within the disk drive unit 100 included therein, the disk drive unit 100 can nevertheless store that information.

While a variety of types of devices have been illustrated and described above that are operable store and playback digital data that is provided in a streaming format or via large portions of data, it is also noted any other type of device that includes a HDD or other memory storage device in which streaming information is provided there from can also employ various aspects of the invention.

Figure 4:
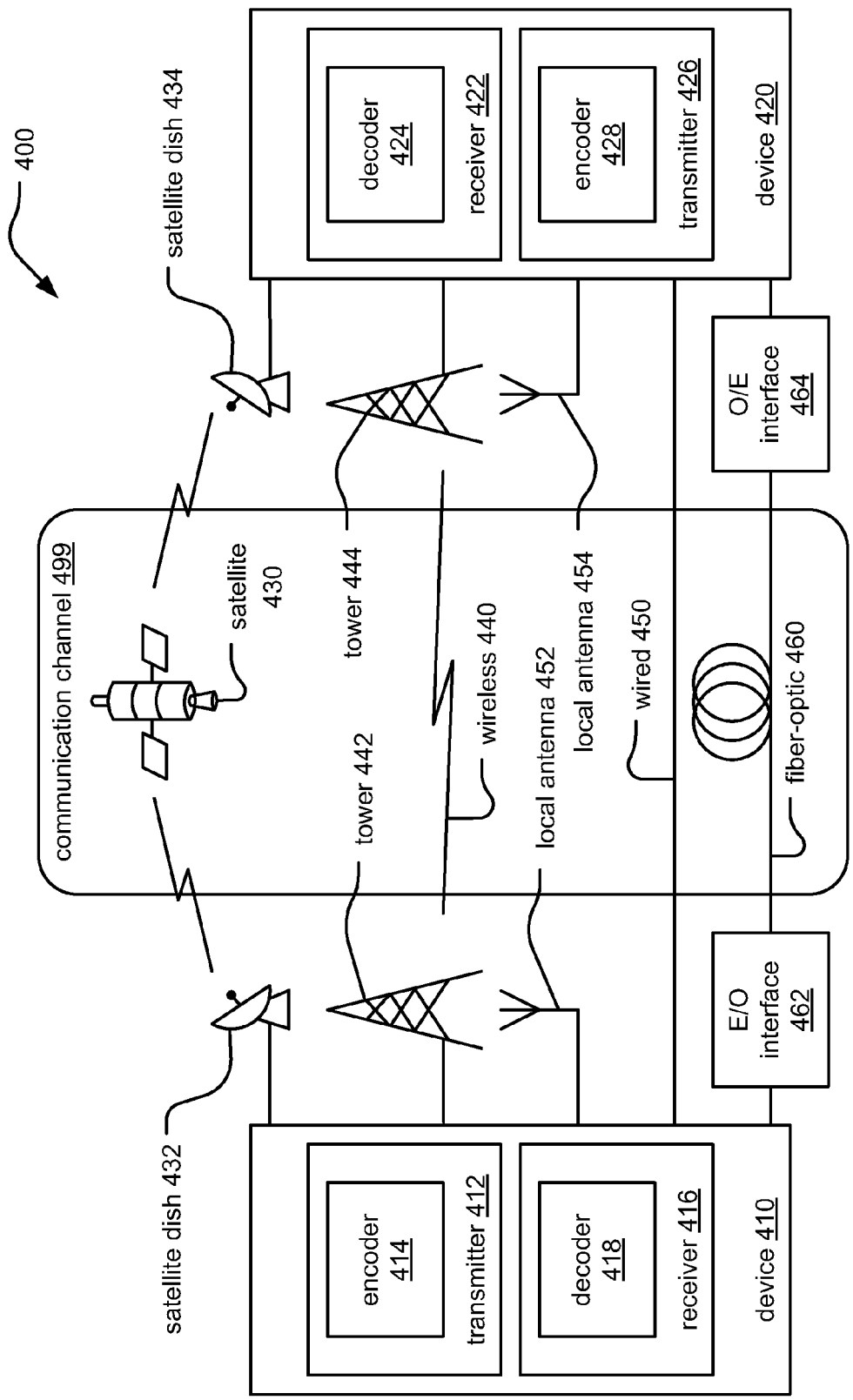
FIG. 4 illustrates an embodiment of a communication system.

FIG. 4 is a diagram illustrating an embodiment of a communication system 400.

Referring to FIG. 4, this embodiment of a communication system 400 is a communication channel 499 that communicatively couples a communication device 410 (including a transmitter 412 having an encoder 414 and including a receiver 416 having a decoder 418) situated at one end of the communication channel 499 to another communication device 420 (including a transmitter 426 having an encoder 428 and including a receiver 422 having a decoder 424) at the other end of the communication channel 499. In some embodiments, either of the communication devices 410 and 420 may only include a transmitter or a receiver. There are several different types of media by which the communication channel 499 may be implemented (e.g., a satellite communication channel 430 using satellite dishes 432 and 434, a wireless communication channel 440 using towers 442 and 444 and/or local antennae 452 and 454, a wired communication channel 450, and/or a fiber-optic communication channel 460 using electrical to optical (E/O) interface 462 and optical to electrical (0/E) interface 464)). In addition, more than one type of media may be implemented and interfaced together thereby forming the communication channel 499.

The signals employed within this embodiment of a communication system 400 can be Reed-Solomon (RS) coded signals, LDPC (Low Density Parity Check) coded signal, turbo coded signals, turbo trellis coded modulation (TTCM), or coded signal generated using some other error correction code (ECC). Any of a very wide variety of applications that employ ECC coding can benefit from various aspects of the invention, including any of those types of communication systems depicted in FIG. 4. Moreover, other types of devices and applications that employ ECC coding (e.g., including those employing some type of HDD or other memory storage means) can also benefit from various aspects of the invention.

Figure 5:
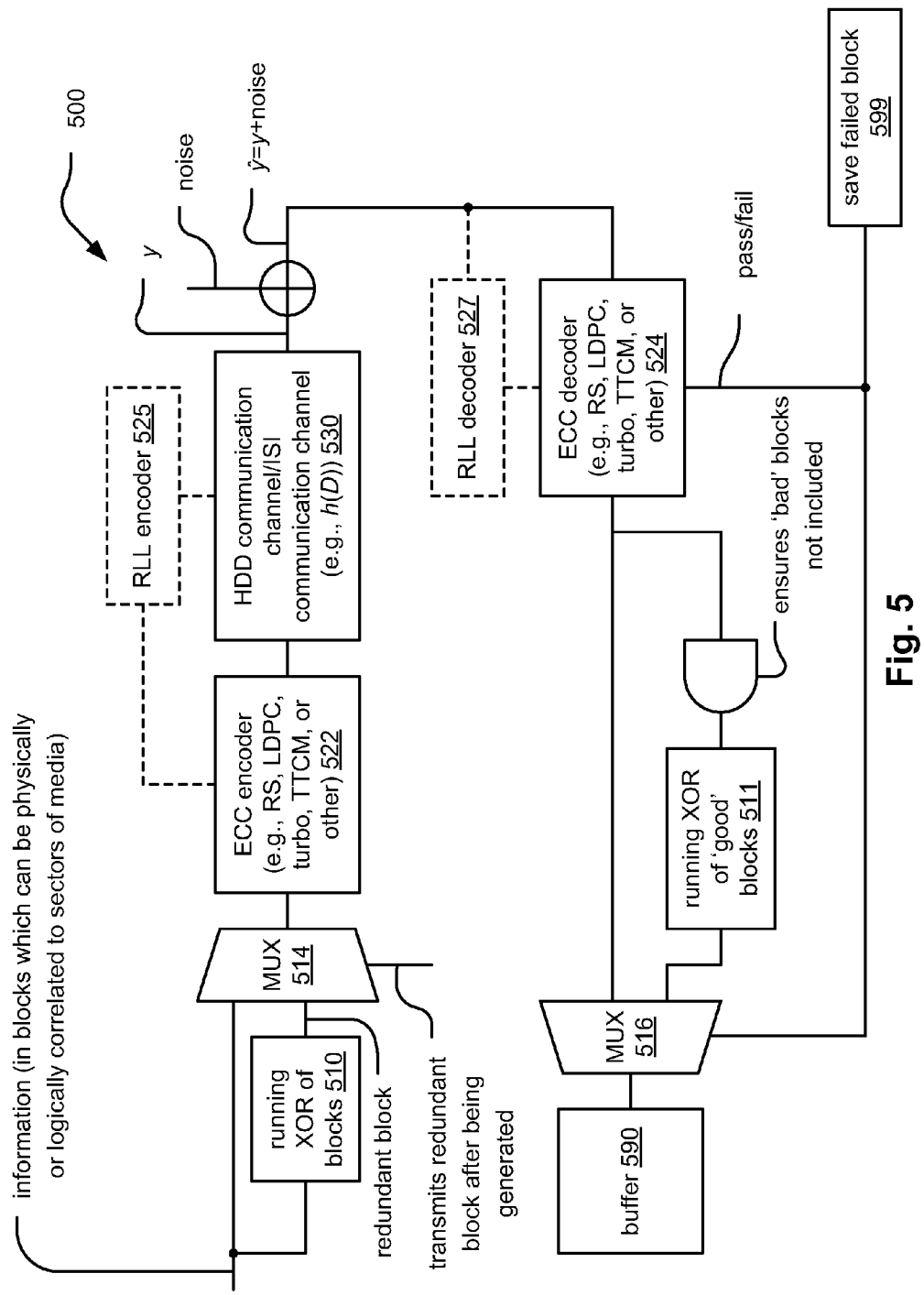
FIG. 5 illustrates an embodiment of a communication system that is operable to encode information thereby generating an error correction code (ECC) super block (which then can be decoded to make estimates of the information encoded within the ECC super block).

FIG. 5 illustrates an embodiment of a communication system 500 that is operable to encode information thereby generating an error correction code (ECC) super block (which then can be decoded to make estimates of the information encoded within the ECC super block).

In this embodiment, information (in blocks which can be physically of logically correlated to sectors of media) are provided to both a multiplexor (MUX) 514 and an XOR logic module 510 that is operable to perform running XOR processing on at least a portion of each serially received block of the information thereby generating a redundant block. The MUX 514 ensures that the blocks of the information are initially transmitted to an ECC encoder 522. After the last block is output from the MUX 514 (at which time the redundant block is completed or near completion), the MUX 514 ensures that the redundant block is then transmitted to the ECC encoder 522. It is noted that any of a variety of ECC codes can be employed by the ECC encoder 522 including Reed-Solomon (RS) coding, LDPC (Low Density Parity Check) coding, turbo coding, and/or turbo trellis code modulation (TTCM) coding.

If desire, an encoder 525 employing a run length limited (RLL) code (and/or a running digital sum (RDS) code) can also operate on the ECC encoded information output from the ECC encoder 522 before being launched into an ISI (Inter-Symbol Interference) communication channel 530 that has a transfer function shown as h(D). In this embodiment, the output from the encoder 525 is an ECC super block that is launched into the ISI communication channel 530. Alternatively, the ECC encoded information output from the ECC encoder 522 (e.g., an ECC super block) can be provided directly to and launched into the ISI communication channel 530.

In some embodiments, the ISI communication channel 530 can be viewed as being the channel through which information is written to and read from the media of a HDD (e.g., oftentimes referred to as the "read channel" in a HDD application context). This communication channel 530 introduces undesirable ISI. The signal that is then output from the ISI communication channel 530 is shown as, y, and after typically incurring some noise, the signal, ŷ=y+noise, is then received by either a decoder 527 (that operates employing the same RLL code (and/or RDS code) as the encoder 525) or to an ECC decoder 524 (that operates employing the same ECC as the ECC encoder 522). In embodiments where the signal, ŷ=y+noise, is received by the decoder 527, the output from the decoder 527 is then provided to the ECC decoder 524.

The ECC decoder 524 is operable to determine whether each component (e.g., each encoded block of the redundant encoded block) of the ECC super block passes or fails. If one of these "information blocks" fails as determined by the ECC decoder 524, then the "block" of the ECC super block that fails is saved, as indicated by reference numeral 599. This pass/fail signal is also provided to a MUX 516. The decoded result from the ECC super block that is output from the ECC decoder 524 is also provided to the MUX 516. This signal also passes through an ANG logic gate (that operates to ensure that no 'bad' blocks are provided to a module 511 that is operable to perform running XOR processing of the 'good' blocks that are being decoded from the ECC decoder 511.

The information that it output from the MUX 516 is then provided to a buffer 590 (which can be a relatively large storage buffer if desired in some embodiments). It is noted that if the last "block" that is output from the module 511 that performs the running XOR processing of the 'good' blocks is in act the actual last "block" decoded from the ECC super block, then there were no errors detected and corrected when decoding the ECC super block. Alternatively, if here was one error when decoding the ECC super block, then the "block" in the module 511 that performs the running XOR processing is in fact the one "block" having the error.

Figure 6:
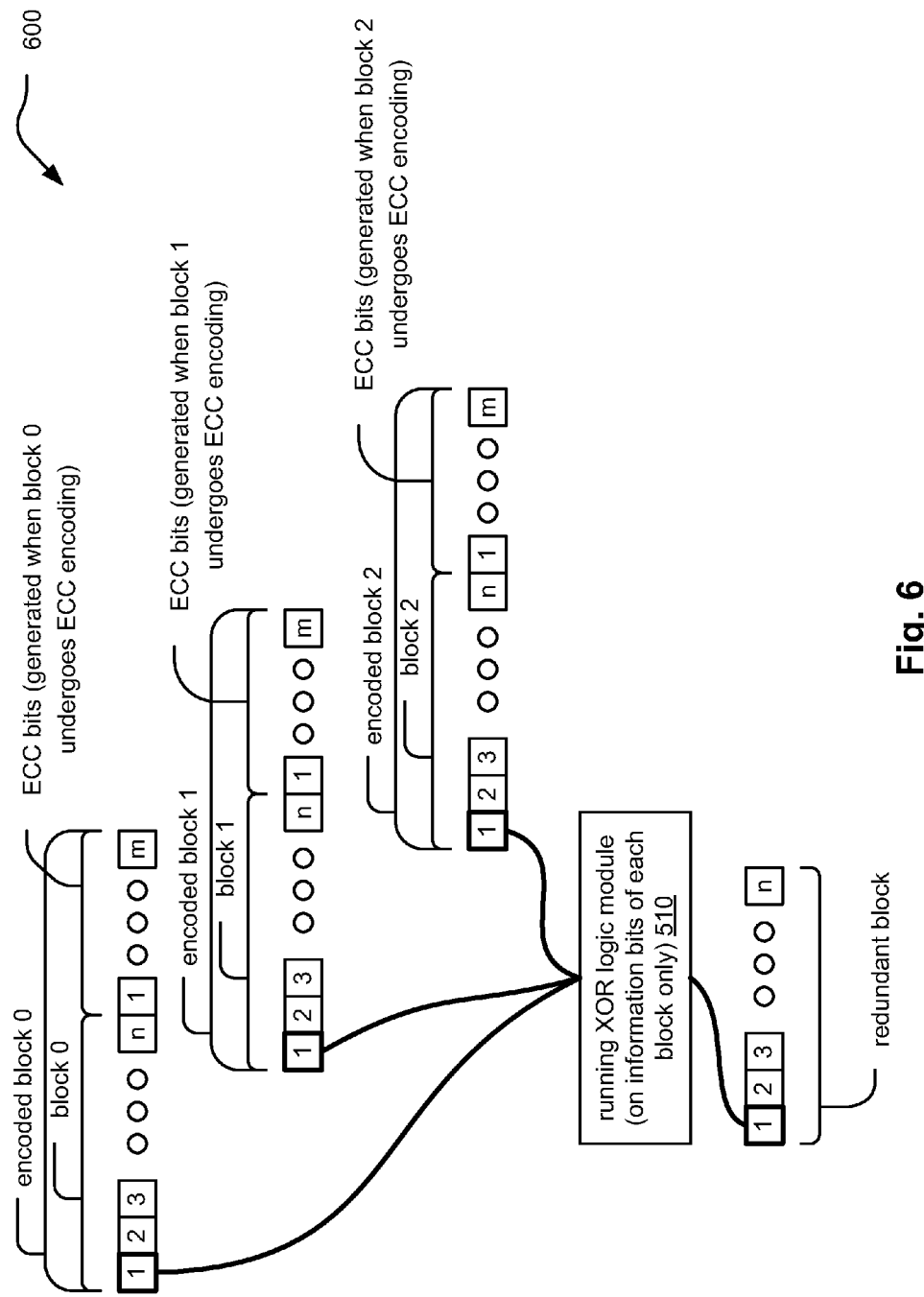
FIG. 6, FIG. 7, and FIG. 8 illustrate embodiments of XOR processing of information contained within blocks in accordance with ECC super block formation.
Figure 7:
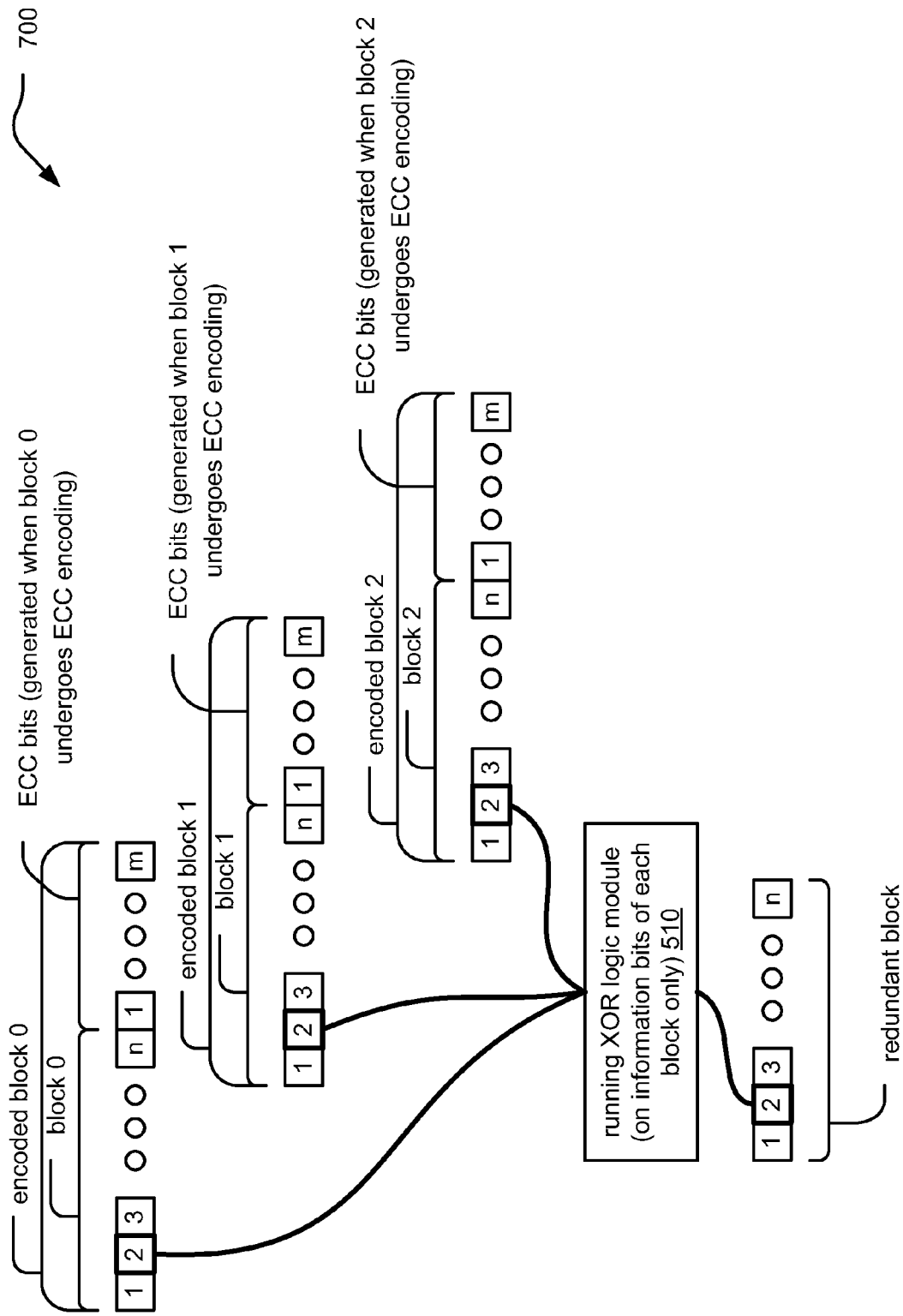
Figure 8:
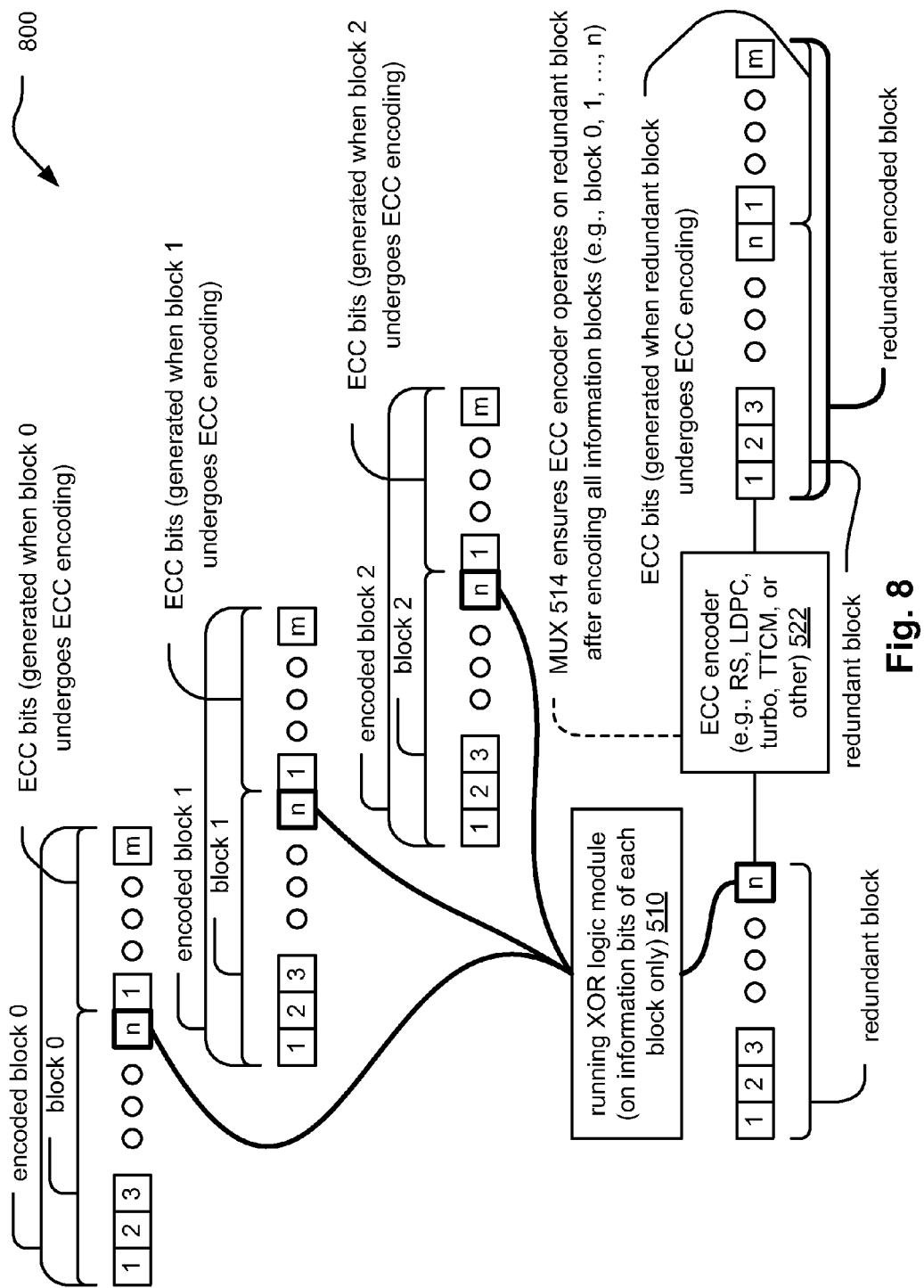

FIG. 6, FIG. 7, and FIG. 8 illustrate embodiments of XOR processing 600, 700, and 800 of information contained within blocks in accordance with ECC super block formation.

Referring to the embodiment 600 of FIG. 6, a block 0 include n information bits, and after undergoing ECC encoding, an additional m parity bits are appended to the block 0 thereby forming an encoded block 0. It is also noted that the encoded block 0 could also undergo additional encoder (e.g., as within the encoder 525 described above) in which case additional redundancy, parity, and/or check bits could also be appended to the encoded block 0. In these embodiments, for illustration, it is presupposed that only ECC encoding is performed on the information blocks.

Similar operations are performed on a block 1 and a block 2 thereby generating an encoded block 1 and an encoded block 2.

A first bit from each of the block 0, block 1, and block 2 (which, in the case of a systematic ECC encoding being performed thereon, can also be viewed as being a first bit from each of the encoded block 0, the encoded block 1, and the encoded block 2) is provided to XOR logic module 510 that is operable to perform running XOR processing on each of these first bits selected from each of the block 0, block 1, and block 2 thereby generating a first bit of a redundant block.

Referring to the embodiment 700 of FIG. 7, a second bit from each of the block 0, block 1, and block 2 (which, in the case of a systematic ECC encoding being performed thereon, can also be viewed as being a second bit from each of the encoded block 0, the encoded block 1, and the encoded block 2) is provided to the XOR logic module 510 that is operable to perform running XOR processing on each of these second bits selected from each of the block 0, block 1, and block 2 thereby generating a second bit of the redundant block.

This XOR processing on the third, fourth, etc. bits of each of the block 0, block 1, and block 2 continues throughout all of the information bits of the each of the block 0, block 1, and block 2. It is also noted that, while only 3 blocks are illustrated in these particular diagrams, clearly more blocks may be included without departing from the scope and spirit of the invention.

Referring to the embodiment 800 of FIG. 8, a last bit (e.g., an $n^{th}$ bit) from each of the block 0, block 1, and block 2 (which, in the case of a systematic ECC encoding being performed thereon, can also be viewed as being an $n^{th}$ bit from each of the encoded block 0, the encoded block 1, and the encoded block 2) is provided to the XOR logic module 510 that is operable to perform running XOR processing on each of these $n^{th}$ bit selected from each of the block 0, block 1, and block 2 thereby generating an $n^{th}$ bit of the redundant block.

It is also noted that each of the blocks (e.g., block 0, block 1, and block 2) can be provided to an ECC encoder (e.g., the ECC encoder 522) to undergo ECC encoding thereby forming the encoded block 0, the encoded block 1, and the encoded block 2 while the individual bits thereof are also provided to the XOR logic module 510 to generate the redundant block.

In addition, once the redundant block has been completely formed, the redundant block is itself provided to the ECC encoder 522 where it undergoes ECC encoding thereby forming a redundant encoded block. If it is supposed that the redundant block includes n bits, then after undergoing ECC encoding, an additional m parity bits are appended to the redundant block thereby forming the redundant encoded block. Therefore, the redundant encoded block itself has an extra layer of ECC in addition to the XOR processing of the "information bits" of the redundant block that are generated by the individual information bits of each of the block 0, block 1, and block 2. This protection as provided by the redundant encoded block provides a greater layer of protection than merely a straightforward parity check. It is again noted that the MUX 514 ensures that the blocks of the information (e.g., block 0, block 1, and block 2 shown in these particular diagrams) are initially transmitted to the ECC encoder 522. After the last block is output from the MUX 514 (at which time the redundant block is completed or near completion), the MUX 514 ensures that the redundant block is then transmitted to the ECC encoder 522 thereby forming the redundant encoded block.

Figure 9:
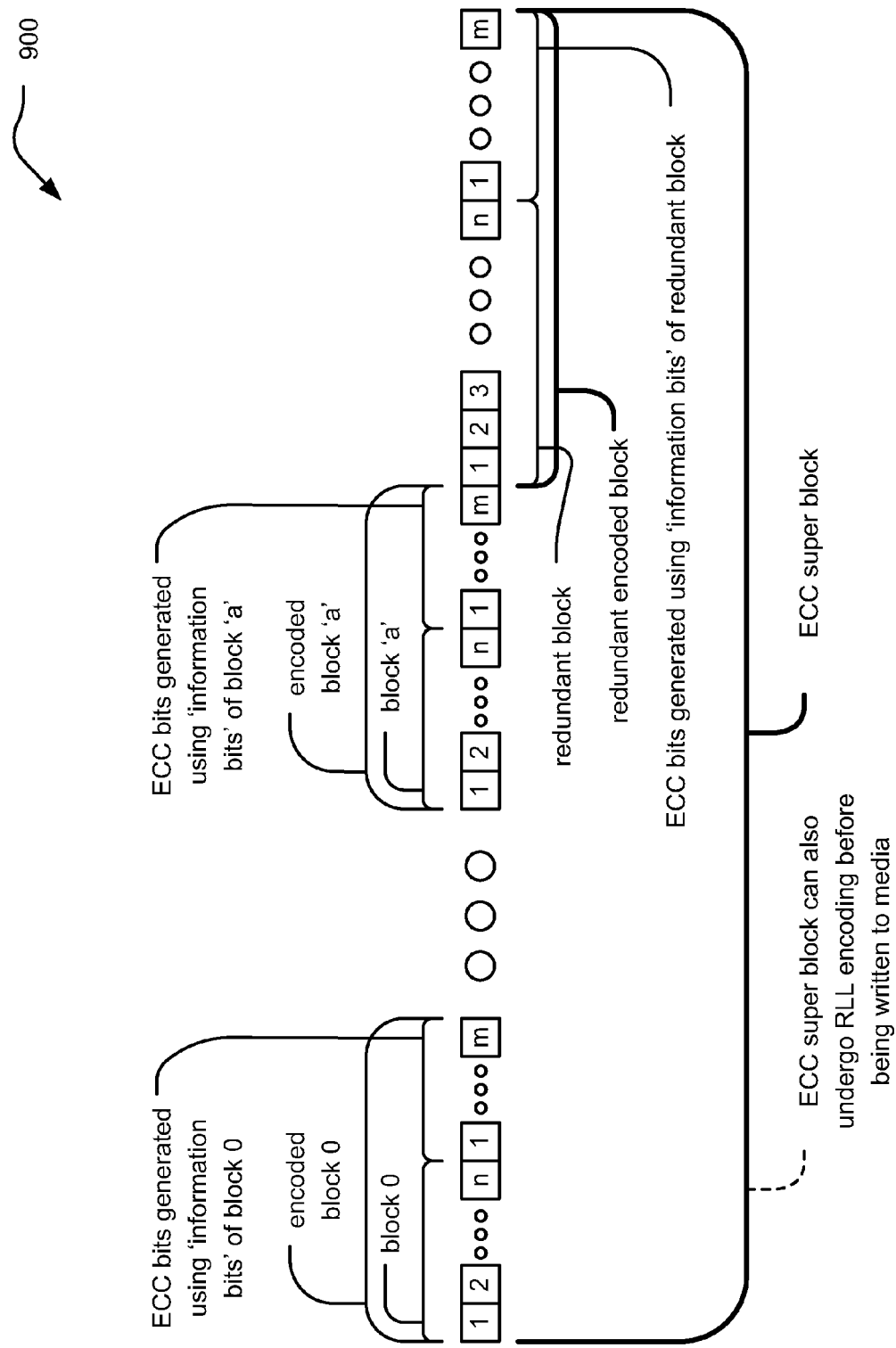
FIG. 9 illustrates an embodiment of an ECC super block.

FIG. 9 illustrates an embodiment of an ECC super block 900. As can be seen, the ECC super block includes a plurality of encoded blocks (shown as an encoded block 0, . . . , and an encoded block 'a'). The ECC bits of each of the encoded blocks are generated when the information bits of that respective block undergo ECC encoding. For example, when the n information bits of block 0 undergo ECC encoding, the m ECC bits (sometimes referred to as redundancy, check, or coded bits) are appended to the block 0 thereby forming the encoded block 0. Similar operations are performed for each of the other blocks up to a final block 'a'.

The redundant block is formed using the XOR processing as described above, and the redundant block (when fully formed) itself undergoes ECC encoding to generate ECC bits of the redundant block; the redundant block and the ECC bits appended thereto form the redundant encoded block.

All of the plurality of encoded blocks and the redundant encoded block form the ECC super block. The ECC super block can then be launched into a communication channel (e.g., transmitted across a communication channel). In some embodiments, this involves writing the ECC super block to a storage media of a HDD. Again, if desired in some embodiments, the ECC super block can undergo additional encoding (e.g., RLL and/or RDS encoding) before being launched into a communication channel.

FIG. 10, FIG. 11, FIG. 12, FIG. 13, FIG. 14, FIG. 15, FIG. 16, and FIG. 17 illustrates embodiments of patterns by which an ECC super block can be written to sectors of storage media (e.g., as in an hard disk drive (HDD) context).

Figure 10:
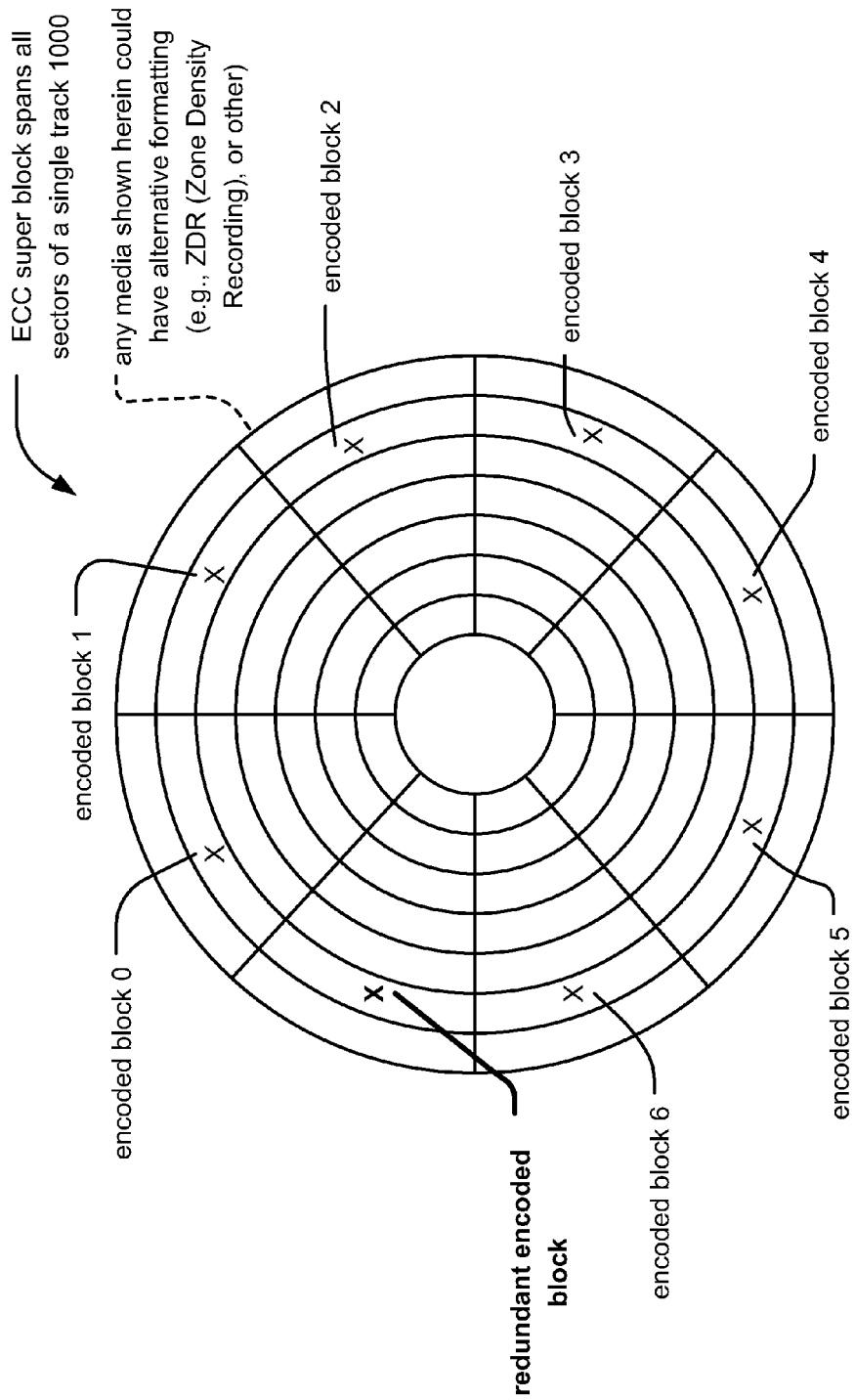
FIG. 10, FIG. 11, FIG. 12, FIG. 13, FIG. 14, FIG. 15, FIG. 16, and FIG. 17 illustrates embodiments of patterns by which an ECC super block can be written to sectors of storage media (e.g., as in an hard disk drive (HDD) context).

Referring to the embodiment 1000 of FIG. 10, each "block" of an ECC super block is written to a subsequent sector within a single track of media (e.g., as in a HDD application). This particular embodiment shows an ECC super block including 8 "blocks" (e.g., 7 encoded blocks and 1 redundant encoded block).

With respect to this embodiment, as well as any other embodiment described herein, it is noted that the media can have any one of a variety of formats. For example, in some instances, the media capacity (e.g., the disk capacity) can be increased with bit density management, one approach of which is Zone Density Recording (ZDR). In this ZDR approach, each disk surface is divided into a plurality (e.g., 16) of circumferential zones. All tracks within a given zone contain a constant number of data sectors. The number of sectors per track varies in different zones; the outermost zone contains the largest number of data sectors and the innermost contains the fewest. Alternatively, the disk surface can merely be partitioned into sectors such that track within each zone of the disk contains the same number of sectors. Regardless of the manner in which the disk is formatted, the various aspects of the invention presented herein can be applied thereto.

Figure 11:
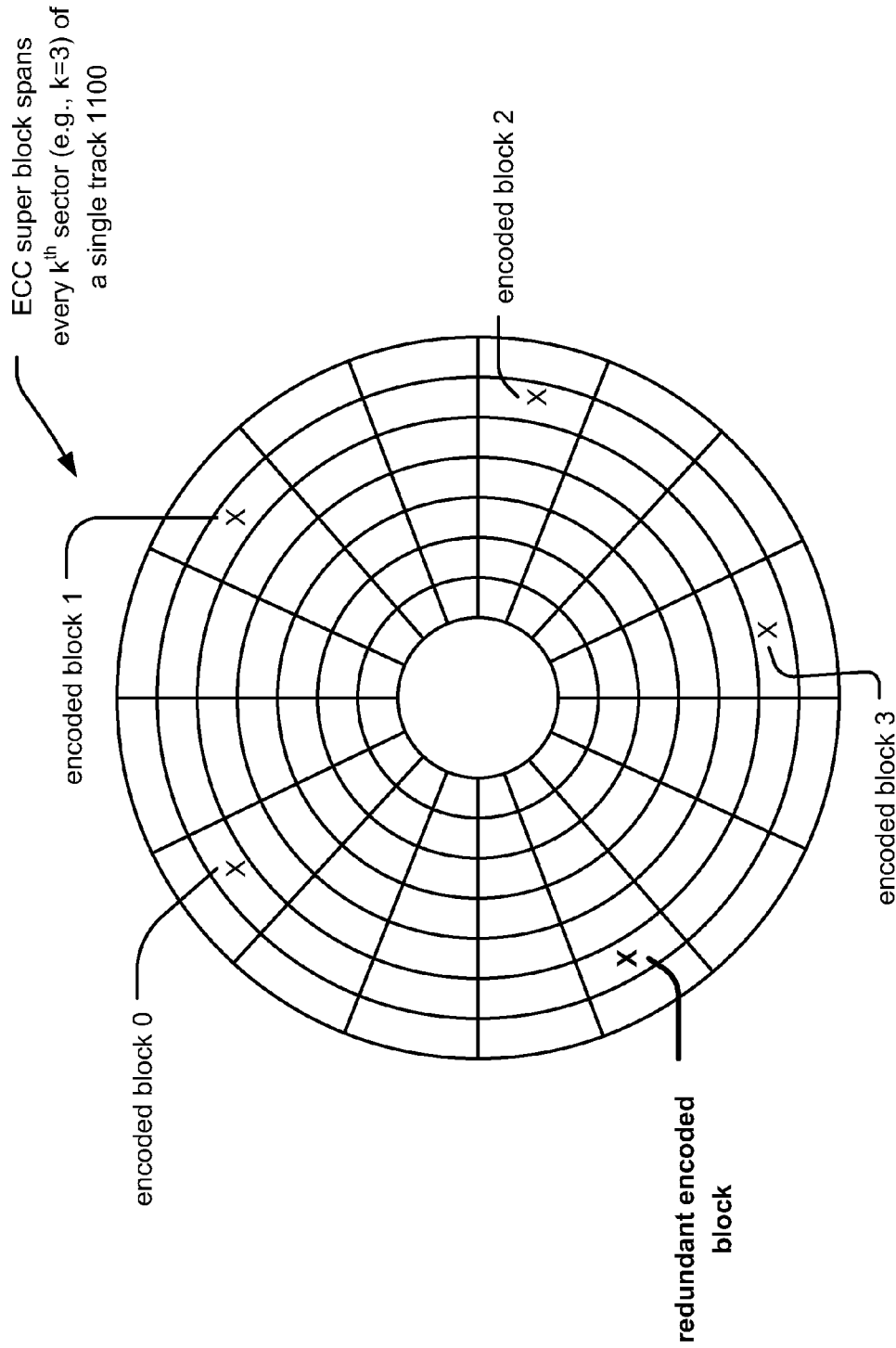

Referring to the embodiment 1100 of FIG. 11, each "block" of an ECC super block is a $k^{th}$ sector of a single track of the media. This particular embodiment shows an ECC super block including 5 "blocks" (e.g., 4 encoded blocks and 1 redundant encoded block).

Figure 12:
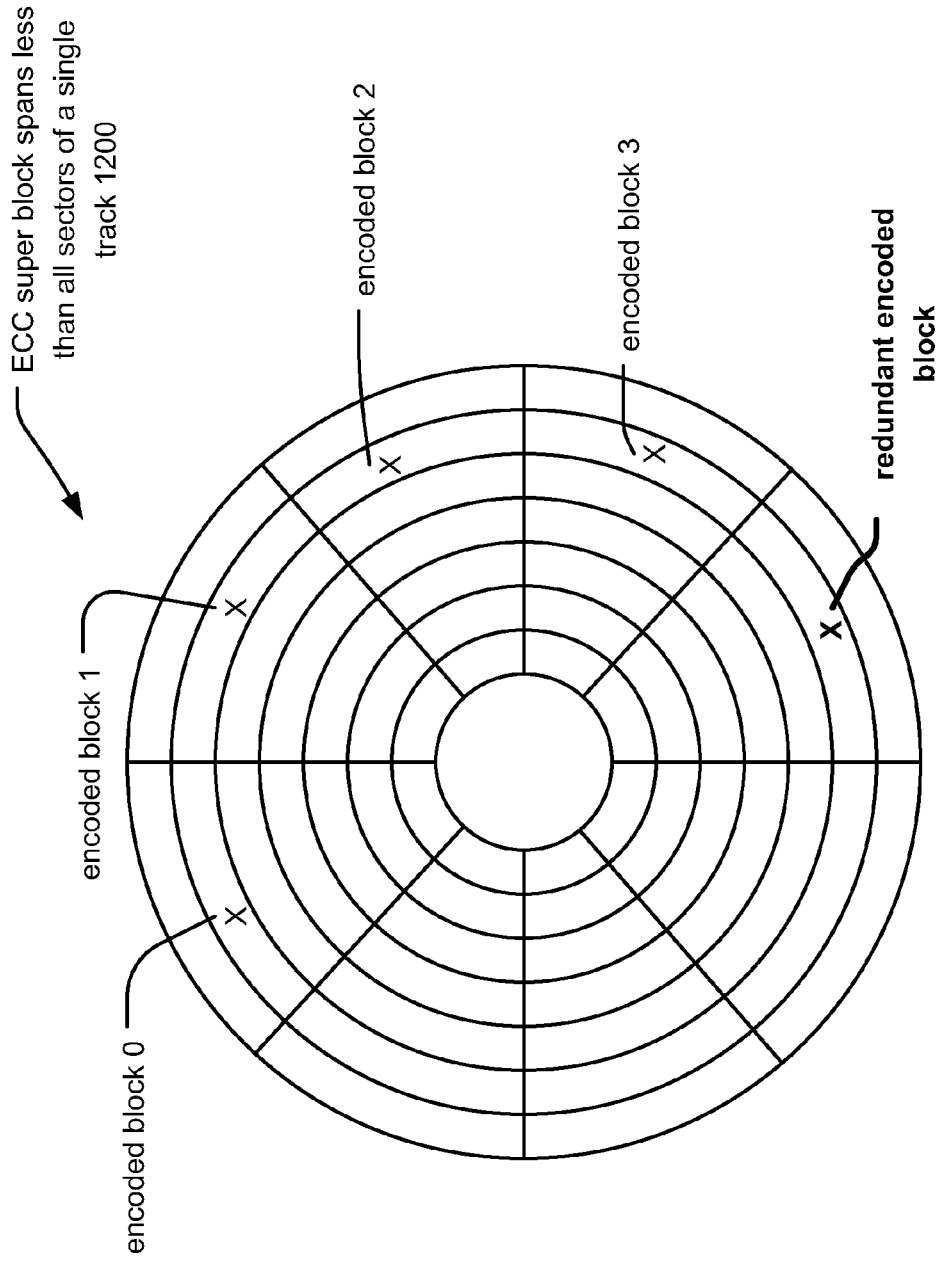

Referring to the embodiment 1200 of FIG. 12, each "block" of an ECC super block is written to a subsequent sector within less than all sectors of a single track of the media. This particular embodiment shows an ECC super block including 5 "blocks" (e.g., 4 encoded blocks and 1 redundant encoded block).

Figure 13:
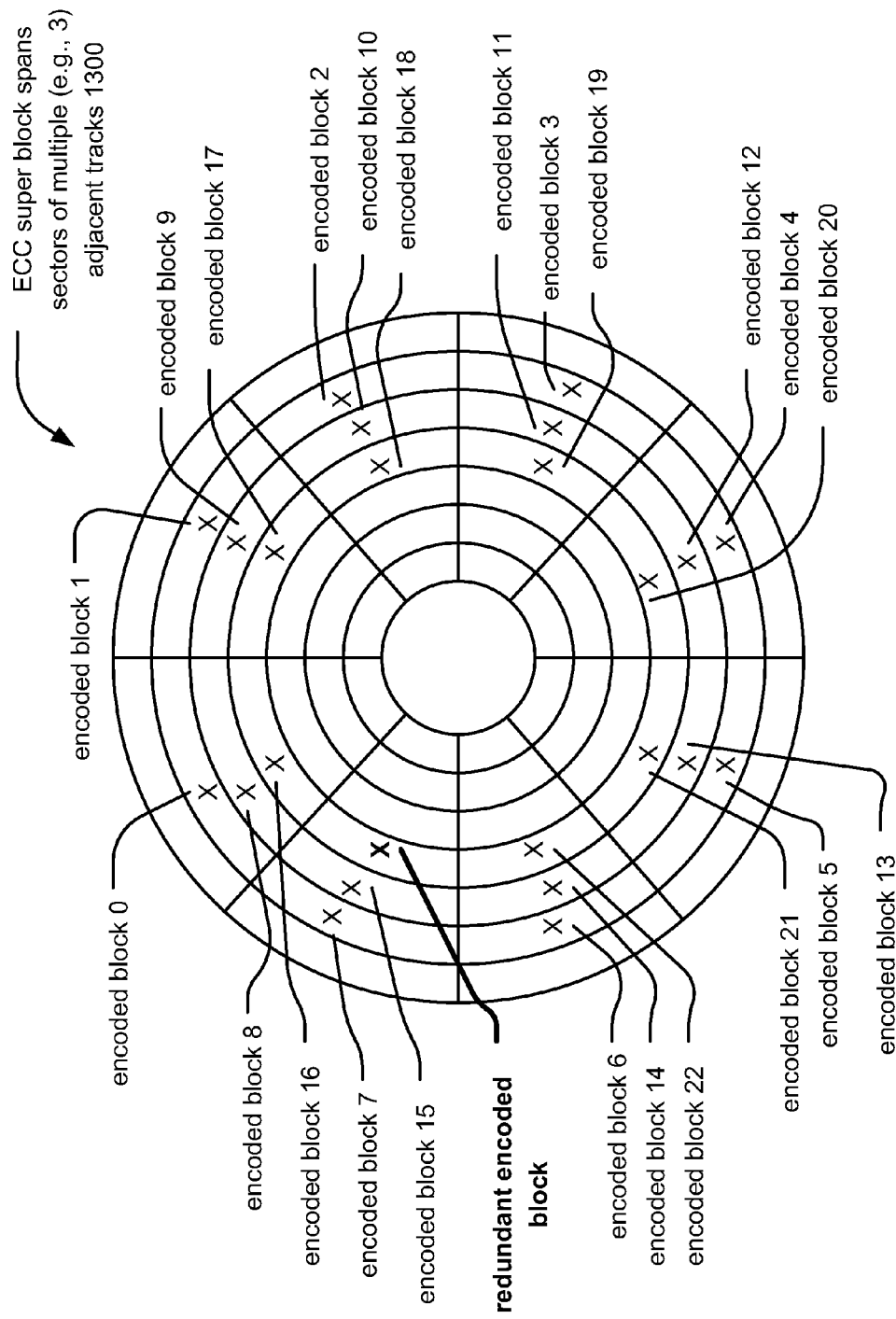

Referring to the embodiment 1300 of FIG. 13, each "block" of an ECC super block is written to a subsequent sector within multiple (e.g., 3 in this embodiment) adjacent tracks of the media. This particular embodiment shows an ECC super block including 24 "blocks" (e.g., 23 encoded blocks and 1 redundant encoded block).

Figure 14:
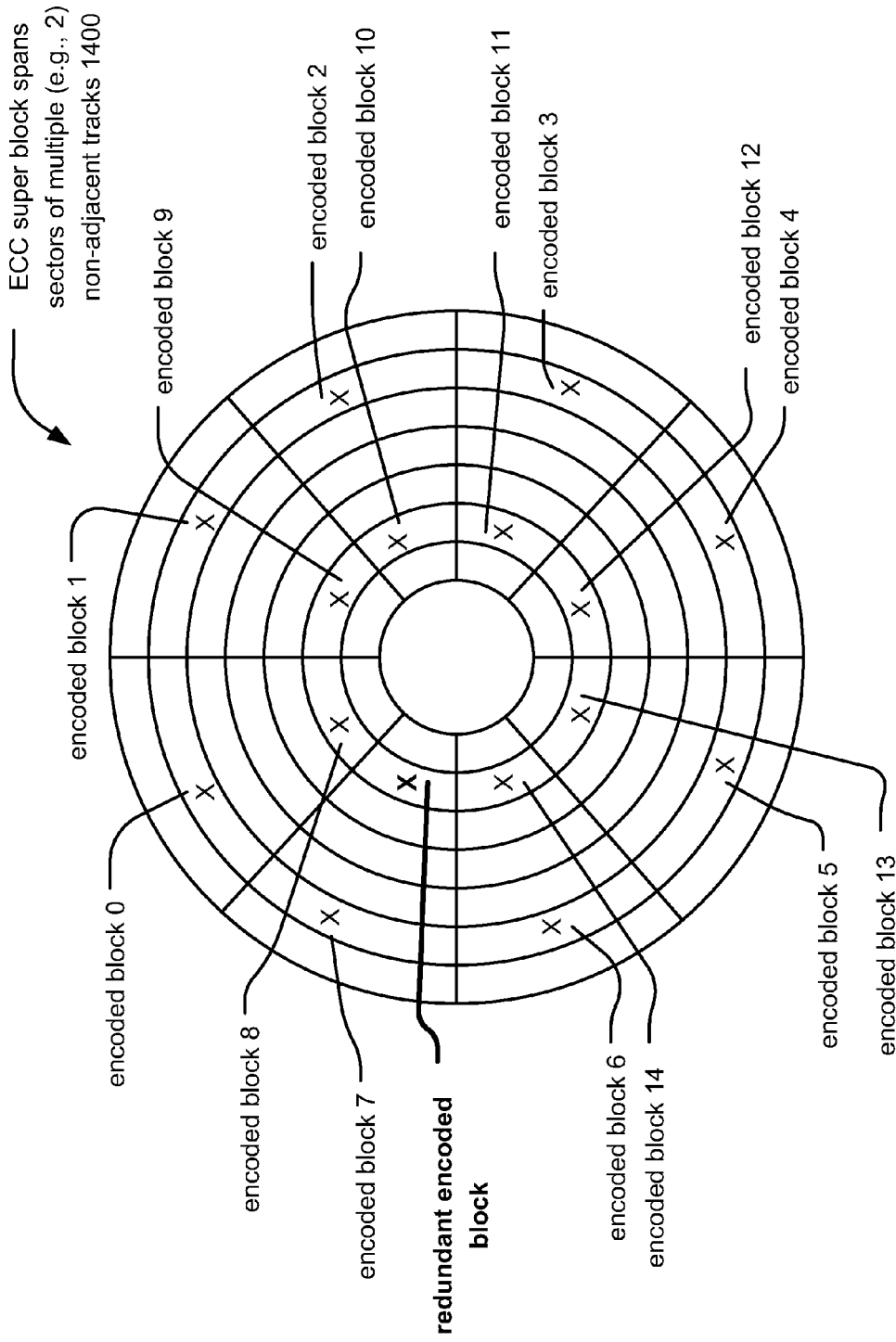

Referring to the embodiment 1400 of FIG. 14, each "block" of an ECC super block is written to a subsequent sector within multiple (e.g., 2 in this embodiment) non-adjacent tracks of the media. This particular embodiment shows an ECC super block including 16 "blocks" (e.g., 15 encoded blocks and 1 redundant encoded block).

Figure 15:
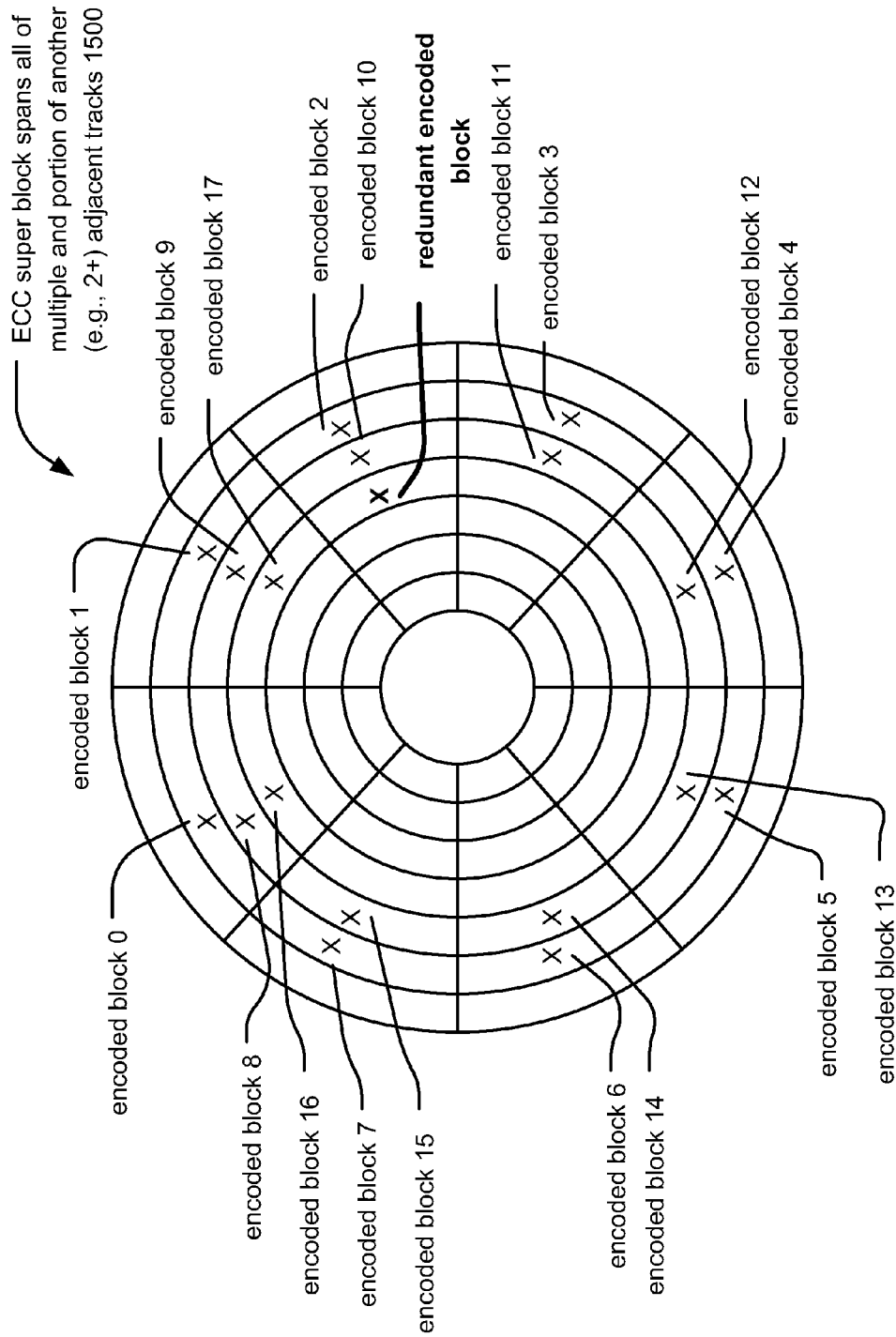

Referring to the embodiment 1500 of FIG. 15, each "block" of an ECC super block is written to a subsequent sector within all of multiple and a portion of another (e.g., 2+ tracks in this embodiment, less than 3 and more than 2 tracks) adjacent tracks of the media. This particular embodiment shows an ECC super block including 19 "blocks" (e.g., 18 encoded blocks and 1 redundant encoded block).

Figure 16:
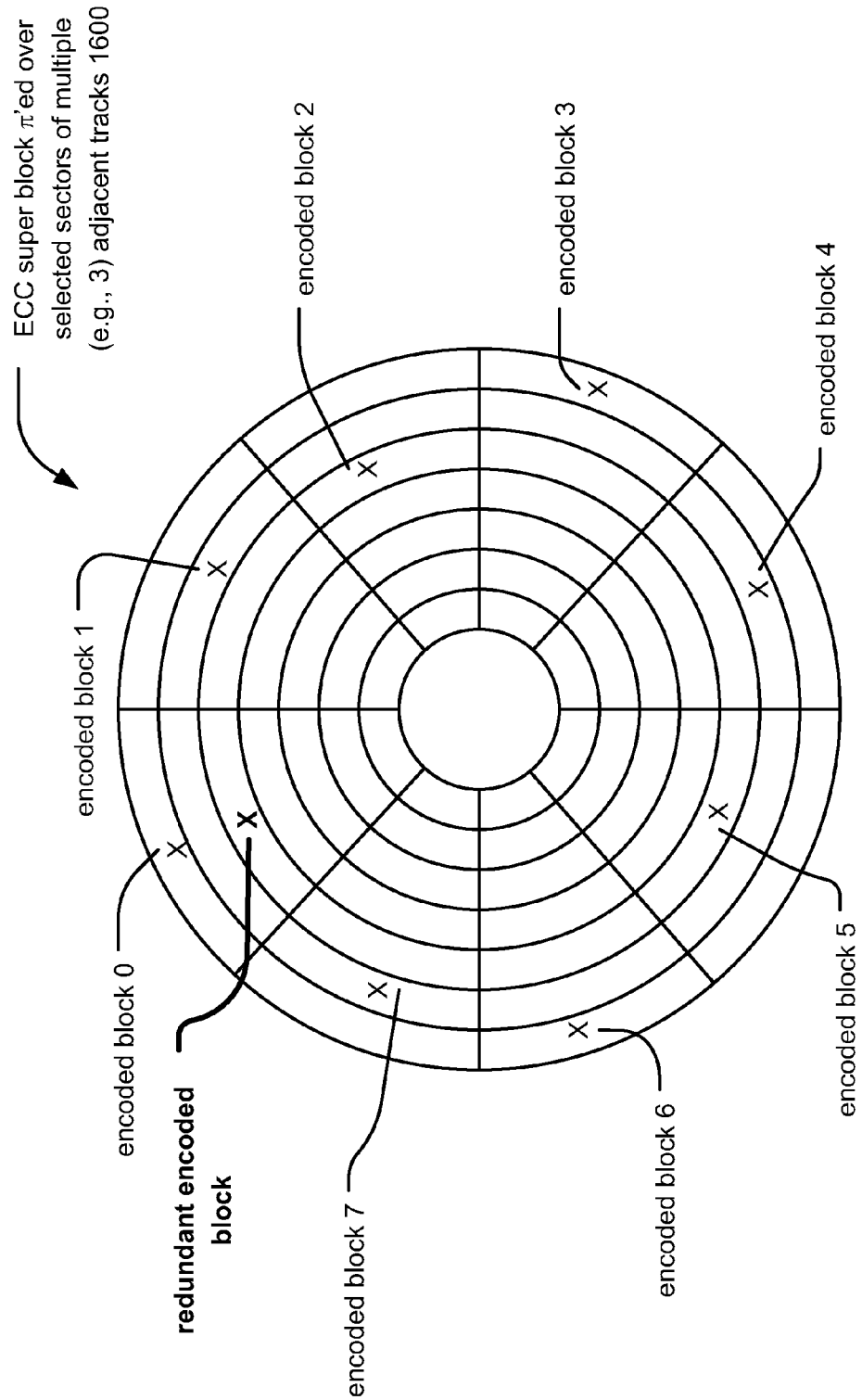

Referring to the embodiment 1600 of FIG. 16, each "block" of an ECC super block is written to the media using an interleaved ($\pi$) pattern over selected sectors of multiple (e.g., 3) adjacent tracks of the media. This particular embodiment shows an ECC super block including 9 "blocks" (e.g., 8 encoded blocks and 1 redundant encoded block).

Figure 17:
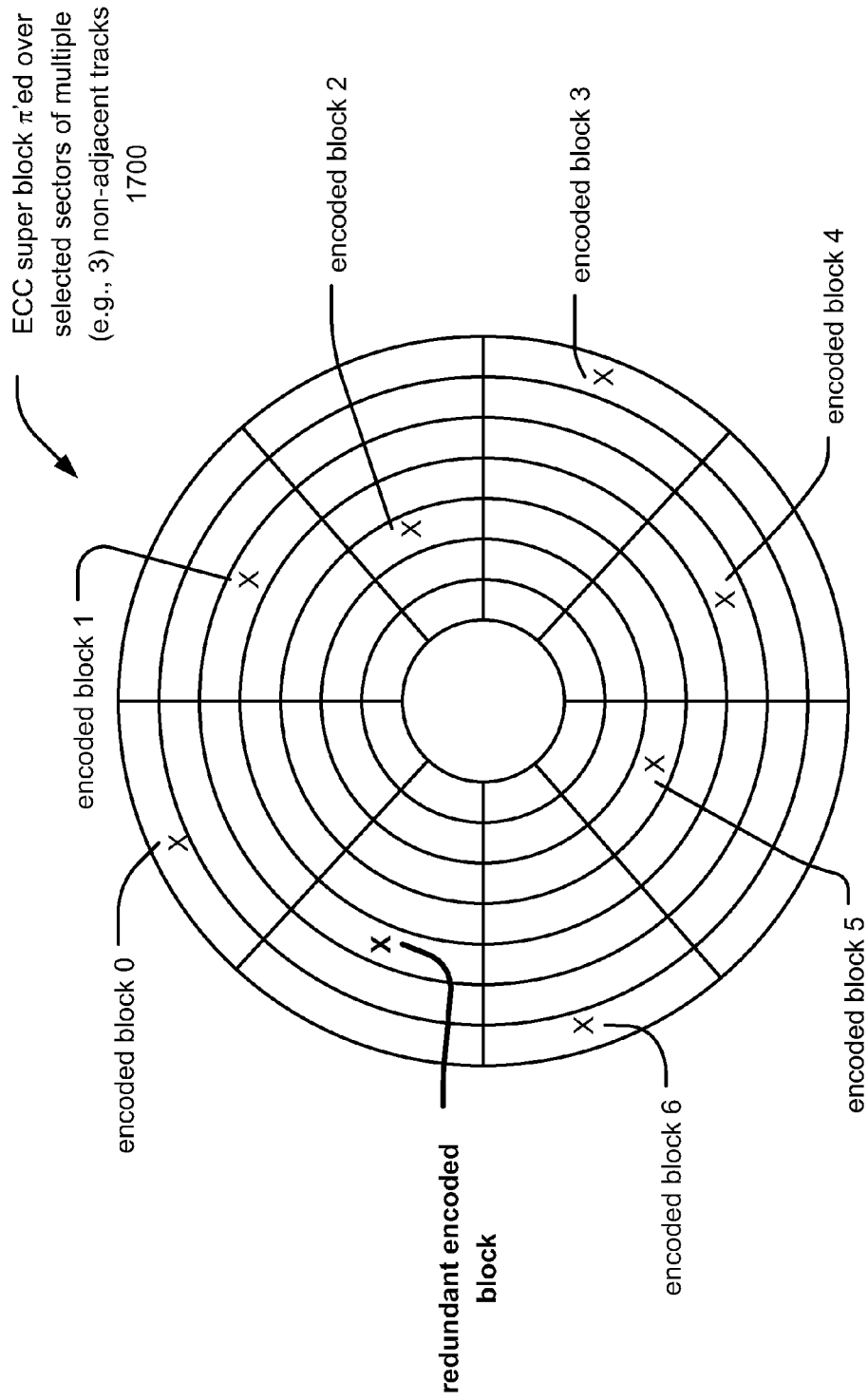

Referring to the embodiment 1700 of FIG. 17, each "block" of an ECC super block is written to the media using an interleaved ($\pi$) pattern over selected sectors of multiple (e.g., 3) non-adjacent tracks of the media. This particular embodiment shows an ECC super block including 8 "blocks" (e.g., 7 encoded blocks and 1 redundant encoded block).

While a number of various embodiments of writing the ECC super block to media are presented herein, it is noted that these various embodiments are not exhaustive of all possible embodiments that can be performed in accordance with certain aspects of the invention.

Figure 18:
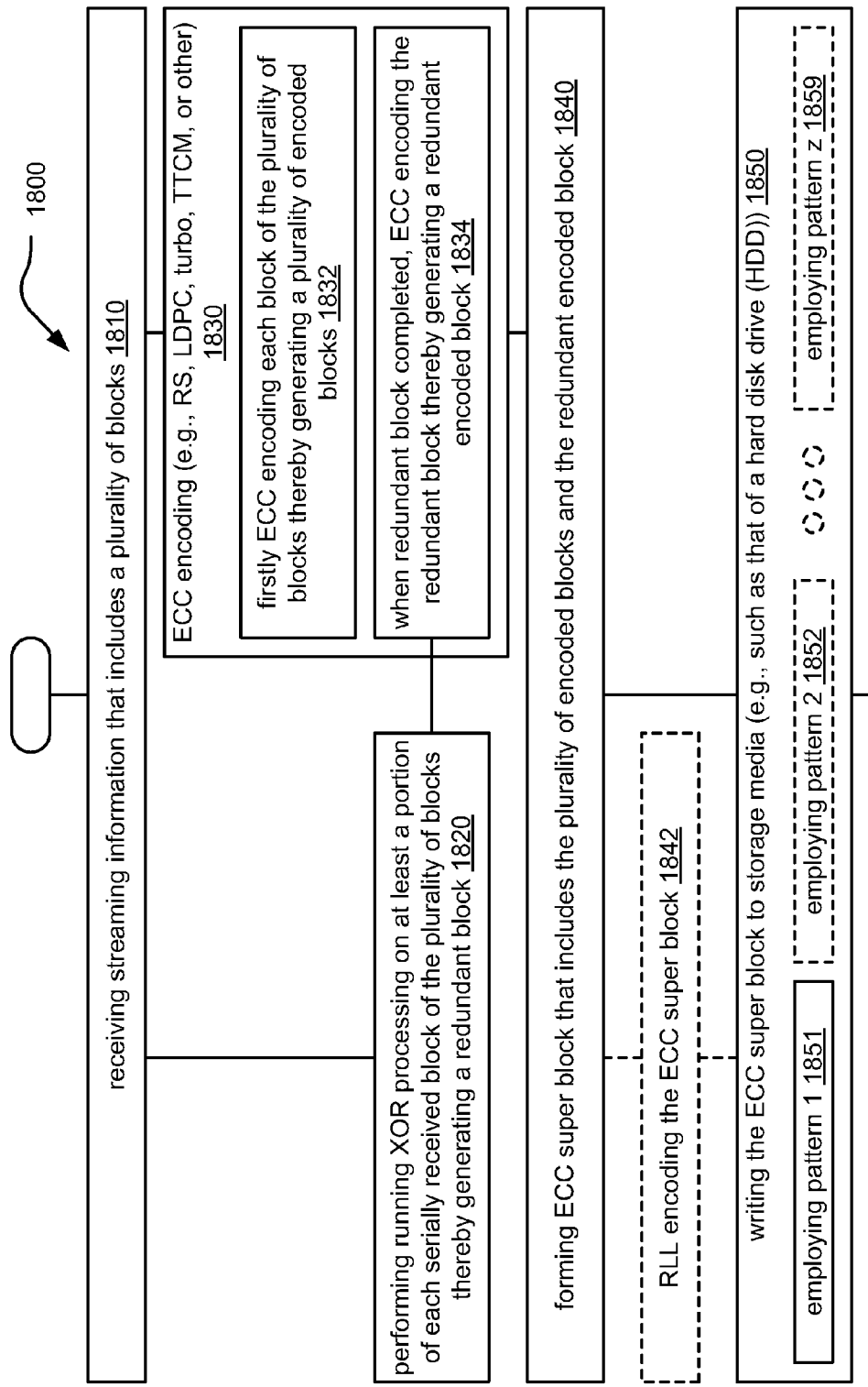
FIG. 18 illustrates an embodiment of a method for encoding information to be written to storage media of a HDD.

FIG. 18 illustrates an embodiment of a method 1800 for encoding information to be written to storage media of a HDD. As shown in a block 1810, the method 1800 begins by receiving streaming information that includes a plurality of blocks. A first block of the plurality of blocks includes a first plurality of information bits, and a second block of the plurality of blocks includes a second plurality of information bits. The method then continues, as shown in a block 1820, by performing running XOR processing on at least a portion of each serially received block of the plurality of blocks thereby generating a redundant block. This XOR processing can be performed such that a first information bit of the first plurality of information bits and a first information bit of the second plurality of information bits undergo XOR processing thereby generating a first bit of the redundant block, and a second information bit of the first plurality of information bits and a second information bit of the second plurality of information bits undergo XOR processing thereby generating a second bit of the redundant block.

While the method 1800 operates by performing the running XOR processing as shown in the block 1820, the method also operates by performing ECC encoding of the blocks as shown in a block 1830. As with respect to other embodiments, it is noted that any of a variety of ECC codes can be employed when performing the ECC encoding including Reed-Solomon (RS) coding, LDPC (Low Density Parity Check) coding, turbo coding, and/or turbo trellis code modulation (TTCM) coding.

The ECC encoding of the block 1830 is performed by firstly performing ECC encoding of each block of the plurality of blocks as shown in a block 1832, and when the redundant block is completed, performing ECC encoding on the redundant block thereby generating a redundant encoded block as shown in a block 1834.

The method 1800 then operates by forming an ECC super block that includes all of the plurality of blocks encoded (e.g., formed by performing ECC encoding on each of the plurality of blocks) and the redundant encoded block (e.g., formed by performing ECC encoding on the redundant block).

As also described with respect to other embodiments, the ECC super block can also undergo additional encoding (e.g., RLL or RDS encoding). As shown in an optional block 1842, the method 1800 operates by RLL encoding the ECC super block.

The method 1800 continues by writing the ECC super block to storage media (e.g., such as that of a HDD) as shown in a block 1850. As also described above with respect to other embodiments, any of a variety of patterns can be employed when writing the ECC super block to the media. Any one of a plurality of patterns (i.e., pattern 1 1851, pattern 2 1852, . . . , pattern z 1859) can be employed when writing the individual "blocks" of the ECC super block to the media.

Moreover, it is also noted that a portion of any "block" of the ECC super block can also be written across more than one sector of the media without departing from the scope and spirit of the invention.

The present invention has also been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claimed invention.

The present invention has been described above with the aid of functional building blocks illustrating the performance of certain significant functions. The boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality. To the extent used, the flow diagram block boundaries and sequence could have been defined otherwise and still perform the certain significant functionality. Such alternate definitions of both functional building blocks and flow diagram blocks and sequences are thus within the scope and spirit of the claimed invention.

One of average skill in the art will also recognize that the functional building blocks, and other illustrative blocks, modules and components herein, can be implemented as illustrated or by discrete components, application specific integrated circuits, processors executing appropriate software and the like or any combination thereof.

Moreover, although described in detail for purposes of clarity and understanding by way of the aforementioned embodiments, the present invention is not limited to such embodiments. It will be obvious to one of average skill in the art that various changes and modifications may be practiced within the spirit and scope of the invention, as limited only by the scope of the appended claims.

What is claimed is:

1. An apparatus, comprising:
a processing module for processing an information signal, including a plurality of blocks therein, thereby generating a redundant block;
a multiplexor (MUX), coupled to the processing module, for firstly outputting each block of the plurality of blocks to the ECC encoder and secondly outputting the redundant block; and
an error correction code (ECC) encoder, coupled to the MUX, for encoding the plurality of blocks and the redundant block thereby generating an ECC super block including a plurality of encoded blocks generated from the plurality of blocks and including a redundant encoded block generated from the redundant block; and
an output for providing the ECC super block to a communication channel.

2. The apparatus of claim 1, wherein:
the processing module for performing XOR processing a first bit of a first of the plurality of blocks and a first bit of a second of the plurality of blocks thereby generating a first bit of the redundant block; and
the processing module for performing XOR processing a second bit of the first of the plurality of blocks and a second bit of the second of the plurality of blocks thereby generating a second bit of the redundant block.

3. The apparatus of claim 1, wherein:
the ECC encoder for encoding a first of the plurality of blocks thereby generating a first of the plurality of encoded blocks including the first of the plurality of blocks and a first plurality of ECC bits;
the ECC encoder for encoding a second of the plurality of blocks thereby generating a second of the plurality of encoded blocks including the second of the plurality of blocks and a second plurality of ECC bits; and
the ECC encoder for encoding the redundant block thereby generating the redundant encoded block including the redundant block and a third plurality of ECC bits.

4. The apparatus of claim 1, wherein:
the ECC encoder for performing at least one of Reed-Solomon (RS) encoding, LDPC (Low Density Parity Check) encoding, turbo encoding, and turbo trellis code modulation (TTCM).

5. The apparatus of claim 1, wherein:
the communication channel coupled to a storage media of a hard disk drive (HDD); and
the ECC super block for being written to a plurality of sectors within at least one track of the storage media of the HDD.

6. The apparatus of claim 1, wherein:
the apparatus being a communication device; and
the communication device operative within at least one of a satellite communication system, a wireless communication system, a wired communication system, and a fiber-optic communication system; and
the communication channel being a satellite communication channel, a wireless communication channel, a wired communication channel, or a fiber-optic communication channel.

7. An apparatus, comprising:
a processing module for processing an information signal, including a plurality of blocks therein, thereby generating a redundant block; and
an error correction code (ECC) encoder for encoding the plurality of blocks and the redundant block thereby generating an ECC super block including a plurality of encoded blocks generated from the plurality of blocks and including a redundant encoded block generated from the redundant block; and
an output for providing the ECC super block to a communication channel.

8. The apparatus of claim 7, wherein:
the processing module for performing XOR processing a first bit of a first of the plurality of blocks and a first bit of a second of the plurality of blocks thereby generating a first bit of the redundant block; and
the processing module for performing XOR processing a second bit of the first of the plurality of blocks and a second bit of the second of the plurality of blocks thereby generating a second bit of the redundant block.

9. The apparatus of claim 7, wherein:
the ECC encoder for encoding a first of the plurality of blocks thereby generating a first of the plurality of encoded blocks including the first of the plurality of blocks and a first plurality of ECC bits;
the ECC encoder for encoding a second of the plurality of blocks thereby generating a second of the plurality of encoded blocks including the second of the plurality of blocks and a second plurality of ECC bits; and
the ECC encoder for encoding the redundant block thereby generating the redundant encoded block including the redundant block and a third plurality of ECC bits.

10. The apparatus of claim 7, further comprising:
a run length limited (RLL) encoder for encoding the ECC super block.

11. The apparatus of claim 7, further comprising:
a multiplexor (MUX), coupled to the processing module and the ECC encoder, for firstly providing each block of the plurality of blocks to the ECC encoder and secondly providing the redundant block to the ECC encoder.

12. The apparatus of claim 7, wherein:
the ECC encoder for performing at least one of Reed-Solomon (RS) encoding, LDPC (Low Density Parity Check) encoding, turbo encoding, and turbo trellis code modulation (TTCM).

13. The apparatus of claim 7, wherein:
the communication channel coupled to a storage media of a hard disk drive (HDD); and
the ECC super block for being written to a plurality of sectors within a single track of the storage media of the HDD.

14. The apparatus of claim 7, wherein:
the communication channel coupled to a storage media of a hard disk drive (HDD); and
the ECC super block for being written to a plurality of sectors that span a plurality of tracks of the storage media of the HDD.

15. The apparatus of claim 7, wherein:
the apparatus being a communication device; and
the communication device operative within at least one of a satellite communication system, a wireless communication system, a wired communication system, and a fiber-optic communication system; and
the communication channel being a satellite communication channel, a wireless communication channel, a wired communication channel, or a fiber-optic communication channel.

16. A method, comprising:
processing an information signal, including a plurality of blocks therein, thereby generating a redundant block; and
error correction code (ECC) encoding the plurality of blocks and the redundant block thereby generating an ECC super block including a plurality of encoded blocks generated from the plurality of blocks and including a redundant encoded block generated from the redundant block; and
providing the ECC super block to a communication channel.

17. The method of claim 16, further comprising:
XOR processing a first bit of a first of the plurality of blocks and a first bit of a second of the plurality of blocks thereby generating a first bit of the redundant block; and
XOR processing a second bit of the first of the plurality of blocks and a second bit of the second of the plurality of blocks thereby generating a second bit of the redundant block.

18. The method of claim 16, further comprising:
ECC encoding a first of the plurality of blocks thereby generating a first of the plurality of encoded blocks including the first of the plurality of blocks and a first plurality of ECC bits;
ECC encoding a second of the plurality of blocks thereby generating a second of the plurality of encoded blocks including the second of the plurality of blocks and a second plurality of ECC bits; and
ECC encoding the redundant block thereby generating the redundant encoded block including the redundant block and a third plurality of ECC bits.

19. The method of claim 16, wherein:
the ECC encoding including at least one of Reed-Solomon (RS) encoding, LDPC (Low Density Parity Check) encoding, turbo encoding, and turbo trellis code modulation (TTCM).

20. The method of claim 16, wherein:
the method being performed within a communication device; and
the communication device operative within at least one of a satellite communication system, a wireless communication system, a wired communication system, and a fiber-optic communication system; and
the communication channel being a satellite communication channel, a wireless communication channel, a wired communication channel, or a fiber-optic communication channel.

* * * * *

UNITED STATES PATENT AND TRADEMARK OFFICE
CERTIFICATE OF CORRECTION

| | | |
|---|---|---|
| PATENT NO. | : 8,132,084 B2 | Page 1 of 1 |
| APPLICATION NO. | : 13/191628 | |
| DATED | : March 6, 2012 | |
| INVENTOR(S) | : William Gene Bliss et al. | |

It is certified that error appears in the above-identified patent and that said Letters Patent is hereby corrected as shown below:

Col. 9, line 7, replace "desire" with --desired--
Col. 14, line 3, in Claim 1: delete "to the ECC encoder"

Signed and Sealed this
Second Day of October, 2012

David J. Kappos
*Director of the United States Patent and Trademark Office*